United States Patent
Salcedo et al.

(10) Patent No.: US 9,673,187 B2
(45) Date of Patent: Jun. 6, 2017

(54) HIGH SPEED INTERFACE PROTECTION APPARATUS

(71) Applicant: Analog Devices, Inc., Norwood, MA (US)

(72) Inventors: Javier Alejandro Salcedo, North Billerica, MA (US); Jonathan Pfeifer, Summerfield, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/796,731

(22) Filed: Jul. 10, 2015

(65) Prior Publication Data
US 2016/0300830 A1    Oct. 13, 2016

Related U.S. Application Data

(60) Provisional application No. 62/144,209, filed on Apr. 7, 2015.

(51) Int. Cl.
*H01L 27/02* (2006.01)

(52) U.S. Cl.
CPC ...... *H01L 27/0259* (2013.01); *H01L 27/0207* (2013.01); *H01L 27/0262* (2013.01)

(58) Field of Classification Search
CPC ............. H01L 27/0259; H01L 27/0262; H01L 27/0207
(Continued)

(56) References Cited

U.S. PATENT DOCUMENTS 3,436,667 A    4/1969  Kedson
4,331,884 A    5/1982  Svedberg
(Continued)

FOREIGN PATENT DOCUMENTS

DE    10 2007 040 875 A1    3/2009
EP         0 168 678 A2    1/1986
(Continued)

OTHER PUBLICATIONS

Jang, Sheng "Novel diode-chain Triggering SCR circuits for ESD protection" Solid-State Elec. vol. 44, Iss. 7 Jul. 1, 2000 pp. 1297-1303.*
(Continued)

*Primary Examiner* — Matthew Landau
*Assistant Examiner* — Grant Withers
(74) *Attorney, Agent, or Firm* — Knobbe, Martens, Olson & Bear LLP

(57) ABSTRACT

The disclosed technology relates to electronics, and more particularly, to protection devices that protect circuits from transient electrical events such as electrical overstress/electrostatic discharge. A protection device includes a semiconductor substrate having formed therein at least two wells and a deep well underlying and contacting the at least two wells. The device additionally includes a first PN diode formed in one of the at least two wells and having a first heavily doped region of a first conductivity type and a first heavily doped region of a second conductivity type, and includes a second PN diode formed in one of the at least two wells and having a second heavily doped region of the first conductivity type and a second heavily doped region of the second conductivity type. The device additionally includes a first PN diode and the second PN diode are electrically shorted by an electrical shorting structure to form a first plurality of serially connected diodes having a threshold voltage. The device further includes a PNPN silicon-controlled rectifier (SCR) having a trigger voltage and comprising the first heavily doped region of the first conductivity type, the at least two wells, the deep well, and the second heavily doped region of the second conductivity type.

30 Claims, 25 Drawing Sheets

(58) Field of Classification Search
USPC .......................................... 257/162, 172, 173
See application file for complete search history.

(56) References Cited

U.S. PATENT DOCUMENTS

| | | |
|---|---|---|
| 4,633,283 A | 12/1986 | Avery |
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,369,041 A | 11/1994 | Duvvury |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,840 A | 4/1999 | Ohuchi et al. |
| 5,895,940 A | 4/1999 | Kim |
| 5,998,813 A | 12/1999 | Bernier |
| 6,097,068 A | 8/2000 | Brown et al. |
| 6,104,589 A | 8/2000 | Williamson |
| 6,137,140 A | 10/2000 | Efland et al. |
| 6,144,542 A | 11/2000 | Ker et al. |
| 6,172,403 B1 | 1/2001 | Chen |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,538,266 B2 | 3/2003 | Lee et al. |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,784,489 B1 | 8/2004 | Menegoli |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,217,461 B1 | 7/2012 | Chu et al. |
| 8,218,276 B2 | 7/2012 | Mallikarjunaswamy |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo et al. |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,686,470 B2 | 4/2014 | Ritter |
| 8,772,091 B2 | 7/2014 | Salcedo et al. |
| 8,796,729 B2 | 8/2014 | Clarke et al. |
| 8,829,570 B2 | 9/2014 | Salcedo et al. |
| 8,860,080 B2 | 10/2014 | Salcedo et al. |
| 8,890,248 B2 | 11/2014 | Pauletti et al. |
| 8,946,822 B2 | 2/2015 | Salcedo et al. |
| 8,947,841 B2 | 2/2015 | Salcedo et al. |
| 8,963,200 B2 | 2/2015 | Lee et al. |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164351 A1 | 8/2004 | Petruzzello et al. |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2005/0269641 A1 | 12/2005 | Lai et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2007/0007545 A1 | 1/2007 | Salcedo et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1* | 1/2012 | Salcedo ............... H01L 27/0259 361/56 |
| 2012/0199874 A1 | 8/2012 | Salcedo et al. |

(56) References Cited

U.S. PATENT DOCUMENTS

| | | |
|---|---|---|
| 2012/0205714 A1 | 8/2012 | Salcedo et al. |
| 2012/0211869 A1 | 8/2012 | Lee et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1 | 11/2014 | Salcedo et al. |
| 2016/0204096 A1 | 7/2016 | Zhao et al. |

FOREIGN PATENT DOCUMENTS

| | | |
|---|---|---|
| EP | 0 915 508 A1 | 5/1999 |
| EP | 1 703 560 A2 | 9/2006 |
| KR | 10-2005-0098458 A | 10/2005 |
| KR | 10-2006-0067100 | 2/2006 |
| KR | 10-2009-0123683 | 12/2009 |
| KR | 10-2010-0003569 | 1/2010 |

OTHER PUBLICATIONS

European Examination Report dated Sep. 27, 2016 for Application No. 14167969.6 in 6 pages.

Anderson et al., ESD Protection under Wire Bonding Pads, EOS/ESD Symposium 99-88, pp. 2A.4.1—2A.4.7 (1999).

Chang et al., High-k Metal Gate-bounded Silicon Controlled Rectifier for ESD Protection, 34th Electrical Overstress/Electrostatic Discharge Symposium, Sep. 2012, 7 pages.

Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.

Parthasarathy, S., Salcedo, J.A., Hajjar, J., Analog Devices, Wilmington, MA, USA, Design of SCR Devices for SiGe BiCMOS Applications, Bipolar/BiCMOS Circuits and Technology Meeting (BCTM), 2011 IEEE, p. 235-238.

Petr Betak: "An Advanced SCR Protective Structure Against ESD Stress". Proceedings of the 13th Conference Student EEICT 2007, vol. 4, Jan. 2007, pp. 286-290.

Salcedo et al., Bidirectional Devices for Automotive-Grade Electrostatic Discharge Applications, IEEE Electron Device Letters, vol. 33, No. 6, Jun. 2012, 3 pages.

Salcedo et al., Electrostatic Discharge Protection Framework for Mixed-Signal High Voltage CMOS Applications, IEEE Xplore, downloaded Feb. 23, 2010 at 12:53 EST, 4 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

Xi et al., "Design and characterization of ESD solutions with EMC robustness for automotive applications," Microelectronics Reliability 55 (2015) 2236-2246.

European Patent Office Search Report for Application No. EP 14 16 7869 dated Oct. 24, 2014, 10 pages.

* cited by examiner

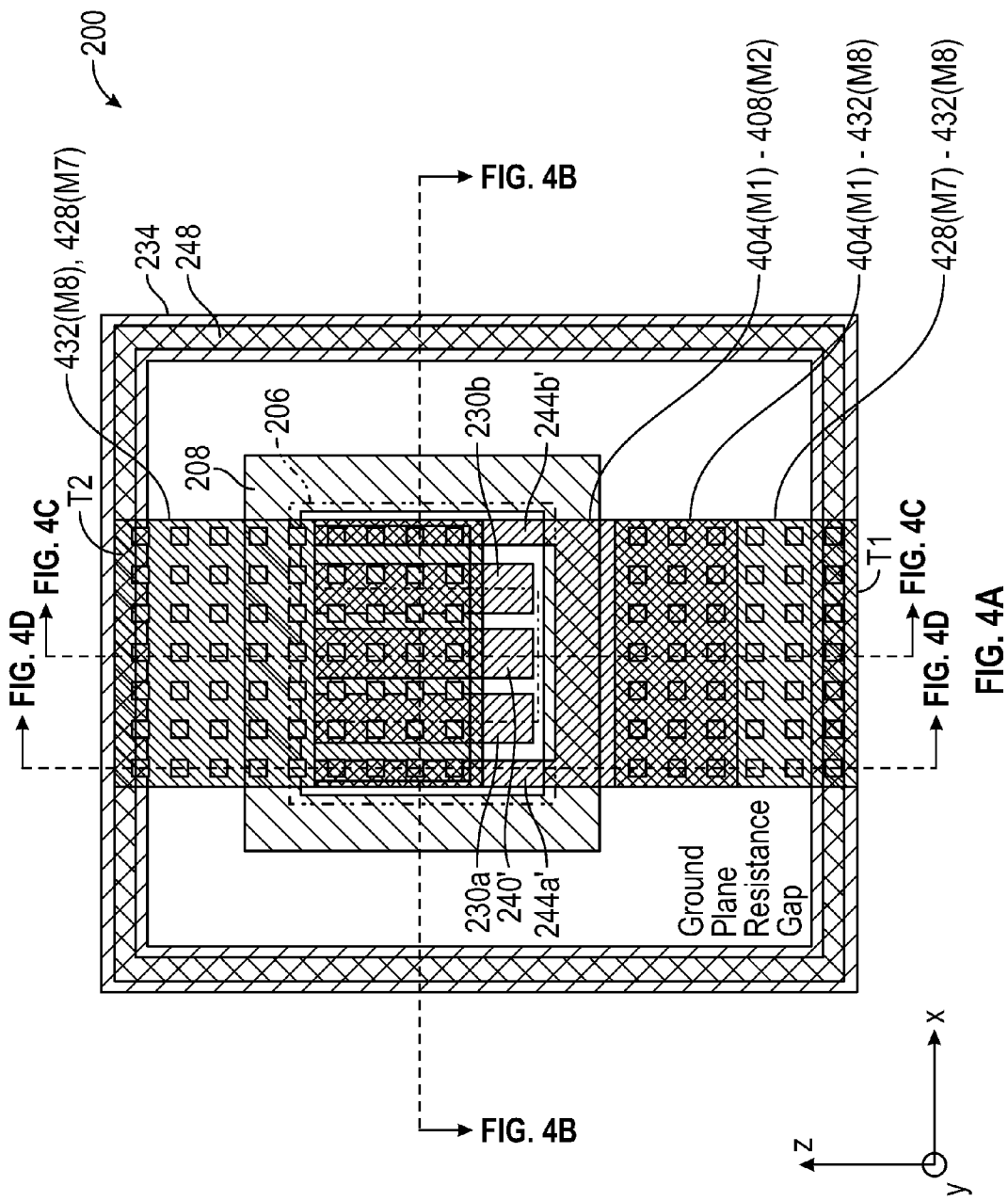

HIGH SPEED INTERFACE PROTECTION APPARATUS

CROSS-REFERENCE TO RELATED APPLICATION

This application claims the benefit of U.S. Provisional Application No. 62/144,209, filed Apr. 7, 2015, the content of which is hereby incorporated by reference in its entirety.

FIELD

The disclosed technology generally relates to integrated circuit devices capable of high data rate communication, and more particularly, to bipolar blocking voltage switch devices and device architectures for protecting circuits from transient electrical events, such as electrical overstress/electrostatic discharge.

BACKGROUND

Certain electronic systems can be exposed to transient electrical events that last a relatively short duration and have rapidly changing voltages and/or currents. Transient electrical events can include, for example, overvoltage, electrostatic discharge (ESD) or electromagnetic overstress (EOS) events arising from the abrupt release of charge from a power source, external object or person to an electronic system.

Transient electrical events can damage integrated circuits (ICs) inside an electronic system due to overvoltage conditions and/or high levels of power dissipation over relatively small areas of the ICs. This rapid and high dissipation of power can potentially lead to damage to core circuits, resulting in gate oxide punch-through, junction damage, metal damage, and/or surface charge accumulation, among other damaging phenomena. Moreover, transient electrical events can induce latch-up due to inadvertent creation of a low-impedance path, thereby disrupting the functioning of the IC and potentially causing permanent damage to the IC. Reliable high speed communication ICs often need to simultaneously have relatively low and relatively linear input loading capacitance between an interface terminal and a ground reference. Such characteristics, however, pose many challenges in broad band/high data rate communication system designs using CMOS technologies. Accordingly, there is a need for circuit interface device architectures for reliable design of broad band/high data rate communication systems using CMOS technologies.

SUMMARY

In some embodiments, an integrated circuit device includes a semiconductor substrate having formed therein at least two wells and a deep well underlying and contacting the at least two wells. The device additionally includes a first PN diode formed in one of the at least two wells and having a first heavily doped region of a first conductivity type and a first heavily doped region of a second conductivity type, and includes a second PN diode formed in one of the at least two wells and having a second heavily doped region of the first conductivity type and a second heavily doped region of the second conductivity type. The device additionally includes a first PN diode and the second PN diode are electrically shorted by an electrical shorting structure to form a first plurality of serially connected diodes having a threshold voltage. The device further includes a PNPN silicon-controlled rectifier (SCR) having a trigger voltage and comprising the first heavily doped region of the first conductivity type, the at least two wells, the deep well, and the second heavily doped region of the second conductivity type.

In some embodiments, an integrated circuit apparatus includes at least one integrated semiconductor device formed in a semiconductor substrate. The at least one integrated device in turn includes a first well of a first conductivity type having formed therein a first PN diode comprising a first heavily doped region of a first conductivity type and a first heavily doped region of a second conductivity type. The first well also has formed at a surface a first floating metal layer between the first heavily doped region of the first conductivity type and the first heavily doped region of the second conductivity type. The at least one device additionally includes a plurality of wells of a second conductivity type formed at a lateral side of the first well of the first conductivity type, where each well of the second conductivity type has a surface on which a floating metal layer is formed. The at least one device additionally includes a plurality of wells of the first conductivity type formed at the lateral side of the first well of the first conductivity type and alternating with the wells of the second conductivity type in a lateral direction. Each one of the plurality of wells of the first conductivity type has formed therein a diode comprising a heavily doped region of the first conductivity type, a heavily doped region of the second conductivity type and a floating metal layer formed at a surface between the respective heavily doped region of the first conductivity type and the respective heavily doped region of the second conductivity type.

BRIEF DESCRIPTION OF THE DRAWINGS

FIG. 4A is a schematic plan view illustrating multiple levels of device layout of a high speed interface protection device, according to some embodiments.

FIG. 12-FIG. 18A are cross-sectional views of high speed interface protection devices, according to various embodiments.

DETAILED DESCRIPTION

Emerging integrated circuits (IC) for high speed communication applications that are fabricated using low voltage CMOS processes, e.g., sub-100 nm CMOS processes, have an increasing need for protection against transient electrical events that exceed ordinary operating conditions. Generally, various techniques can be employed to protect the main circuitry of the ICs against damaging transient electrical events such as ESD. Some systems employ external off-chip protection devices to ensure that core electronic systems are not damaged in response to the transient electrostatic and electromagnetic events. However, due to performance, cost, and spatial considerations, there is an increasing need for protection devices that are monolithically integrated with the circuitry to be protected within the same integrated circuit. In addition, for high speed communication interface circuits fabricated using advanced CMOS technologies, e.g., 28 nm CMOS technology and beyond, there is a need for higher performance of the protection devices with respect to high speed (e.g., low resistance and low capacitance) and high current capability, without incurring undesirable negative performance penalties on the main device, e.g., excessive leakage.

However, existing integrated protection devices often have undesirably high capacitance and/or or impedance, which can cause the response time of the protection devices to be undesirably long. In addition, device configurations compatible with the need for high current capabilities can also contribute to an undesirably longer response time of the protection devices. In the following, protection devices that can be effectively used in conjunction with high speed communication interface circuits are disclosed, which can provide faster response time, lower leakage, higher breakdown voltage and/or higher current capabilities, among other advantages.

Figure 1:
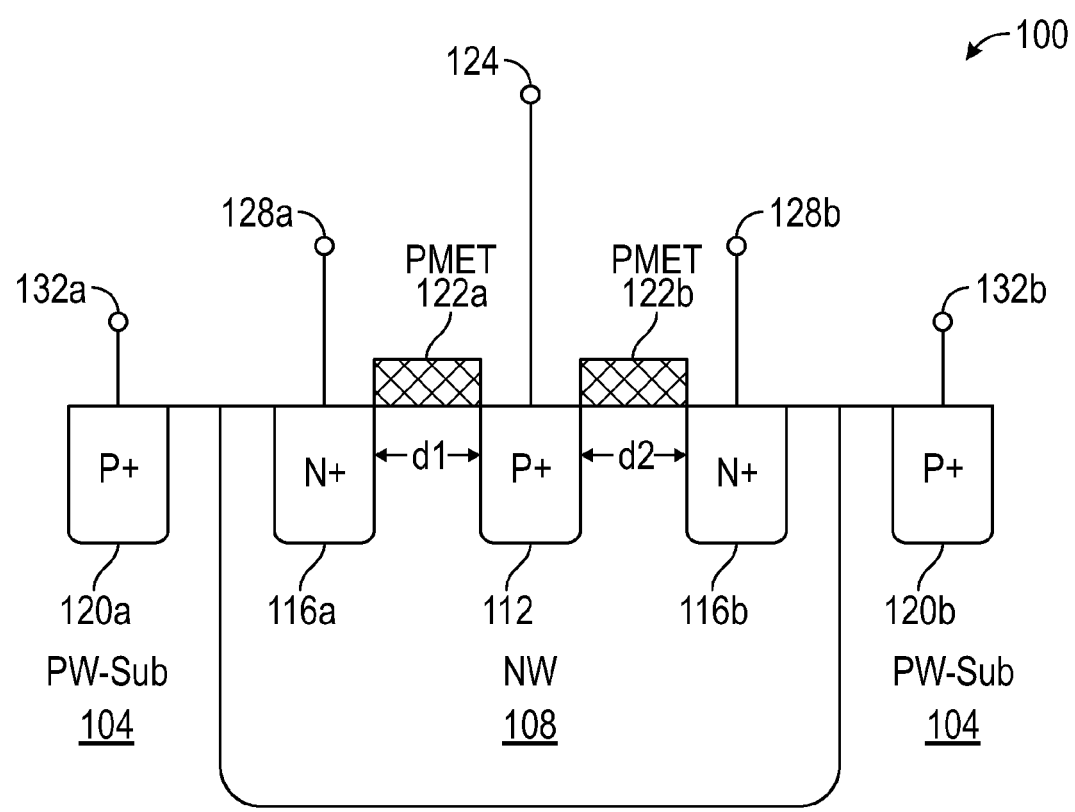
FIG. 1 is a cross-sectional view of an interface protection device.

FIG. 1 illustrates an example protection device 100 for some high-speed applications. The protection device 100 includes a p-well (PW) 104, formed in a substrate, e.g., a silicon substrate, which in turn has formed therein an n-well (NW) 108. A first heavily doped p-type ($p^+$) region 112, a first heavily doped n-type ($n^+$) region 116a and a second heavily doped n-type ($n^+$) region 116b are each formed in the NW 108. In some implementations, the first $n^+$ region 116a and the second $n^+$ region 116b can be electrically connected to each other, or represent different portions of the same $n^+$ region. For example, the first and second n+ regions 116a and 116b can represent cross sections of a ring structure that laterally surrounds the first $p^+$ region 112. The first and second $n^+$ regions 116a and 116b are laterally separated from the first $p^+$ region 112 by lateral distances $d_1$ and $d_2$. On a surface of the NW 108 between the first $n^+$ region 116a and the first $p^+$ region 112, a first electrically floating metal layer 122a is formed. Similarly, on a surface of the NW 108 between the second $n^+$ region 116b and the first $p^+$ region 112, a second electrically floating metal layer 122b is formed. The metal layers 122a and 122b can be formed of, e.g., a metal having a relatively high work function (e.g., >4.6 eV), and can be referred to herein as PMET. In some implementations, the first metal layer 122a does not overlap either of the first $n^+$ region 116a and the first $p^+$ region 112, and the second metal layer 122b does not substantially overlap either of the second $n^+$ region 116b and the first $p^+$ region 112. In some implementations, the first and second metal layers 122a and 122b can also be electrically connected to each other, e.g., to form a ring structure laterally surrounding the first $p^+$ region 112. The first and second metal layers 122a and 122b can substantially cover the entire distance between the heavily doped regions such that they have lengths $d_1$ and $d_2$, respectively. The protection device 100 additionally includes a second $p^+$ region 120a and a third $p^+$ region 120b on opposite sides of the NW 108, which can also be electrically connected to each other, e.g., to form a ring structure laterally surrounding the NW 108. In the illustrated protection device 100, the first and second $n^+$ regions 116a and 116b may be connected to first terminals 128a/128b, the first $p^+$ region 112 may be electrically connected to a second terminal 124, and the second and third $p^+$ regions 120a and 120b may be connected to third terminals 132a/132b. It will be understood that in ring arrangements, two terminals for electrically connected regions can be replaced by a single terminal.

As configured, the first $p^+$ region 112 serves as a p-type region of a PN diode, and the combination of NW 108 and the first $n^+$ region 116a and/or the combination of NW 108 and the second $n^+$ region 116b serves as an n-type region of the PN diode. As described above, in implementations where the first $n^+$ region 116a and the second $n^+$ region 116b are electrically connected, e.g., to form a ring structure surrounding the p+ region 112, the combination of NW 108 surrounding the $p^+$ region 112 and the ring of $n^+$ regions 116a/116b form the n-type region of the PN diode. In operation, the second terminal 124 may serve as an anode terminal and the first terminals 128a/128b may serve as a cathode terminal. As used herein, cathodes and anodes are defined according to the industry convention (i.e., cathode refers to the terminal from which current leaves). In operation, the third terminals 132a and 132b may be connected, e.g., Kelvin-connected, to the substrate, which may be at ground. In some implementations, the first terminals 128a/128b may also be connected to the substrate. When Kelvin-connected, the resistance path from the third terminals 132a/132b to substrate/ground may be substantially higher than the resistance path from the first terminals 128a/128b to substrate/ground, such that when a relatively high voltage signal is received at the first terminal 124, most of the current flows through the lower resistance path through the first terminals 128a and 128b.

When a positive voltage transient electrical signal is received between the second terminal 124 serving as the anode and the first terminals 128a/128b serving as a cathode, the PN diode is forward biased. Conversely, when a negative voltage transient electrical signal is received between the second terminal 124 and the first terminals 128a/128b, the PN diode is reverse biased.

It will be appreciated that the PN diodes in the protection device 100 are configured differently from some high current diodes used in integrated circuit (IC) devices that have heavily doped regions for providing high current density (e.g., $>1\times10^5$ A/cm$^2$) capability. For example, in many integrated PN diodes configured for high current density protection with opposite heavily doped regions disposed in close proximity, similar to the first p$^+$ region 112 and first/second p$^+$ regions 116a/116b, isolation region(s) (e.g., shallow trench isolation) may be included therebetween to prevent various junction breakdown effects, e.g., band-to-band tunneling and junction punch through effects. However, such isolation structures can undesirably increase the path of the minority carriers, which can negatively impact response time of the PN diodes. To mitigate such effects, in the protection device of FIG. 1, the first and second metal layers 122a and 122b are formed on the surface of the NW 108 between the first n$^+$ region 116a and the first p$^+$ region 112, and/or between the second n$^+$ region 116b and the first p$^+$ region 112, respectively. The presence of the metal layers 122a and 122b can increase the voltages at which some breakdown mechanisms occur. While the metal layers 122a and 122b may enable higher proximity between the heavily doped regions, the protection device 100 can still suffer from relatively large net capacitances arising from the junctions and from low voltage leakages under both forward and reverse biases.

In addition, while diode-based protection devices having heavily doped (n+, p+) regions similar to the protection device 100 of FIG. 1 can provide relatively high current density (e.g., $>1\times10^5$ A/cm$^2$), such devices may not be capable of sustaining voltages exceeding the current saturation voltages of the diodes, and/or current densities substantially higher than, e.g., $1\times10^6$ A/cm$^2$, and can be damaged when subject to such conditions.

Thus, there is a need for protection devices for high speed interface applications, which include diode-based protection devices having heavily doped (n$^+$, p$^+$) regions for high current density (e.g., $>1\times10^5$ A/cm$^2$) capabilities, that also have higher breakdown voltages that substantially exceed current saturation voltages of the diodes. There is also a need for such devices to have lower low voltage leakage currents and reduced net capacitance.

Figure 2:
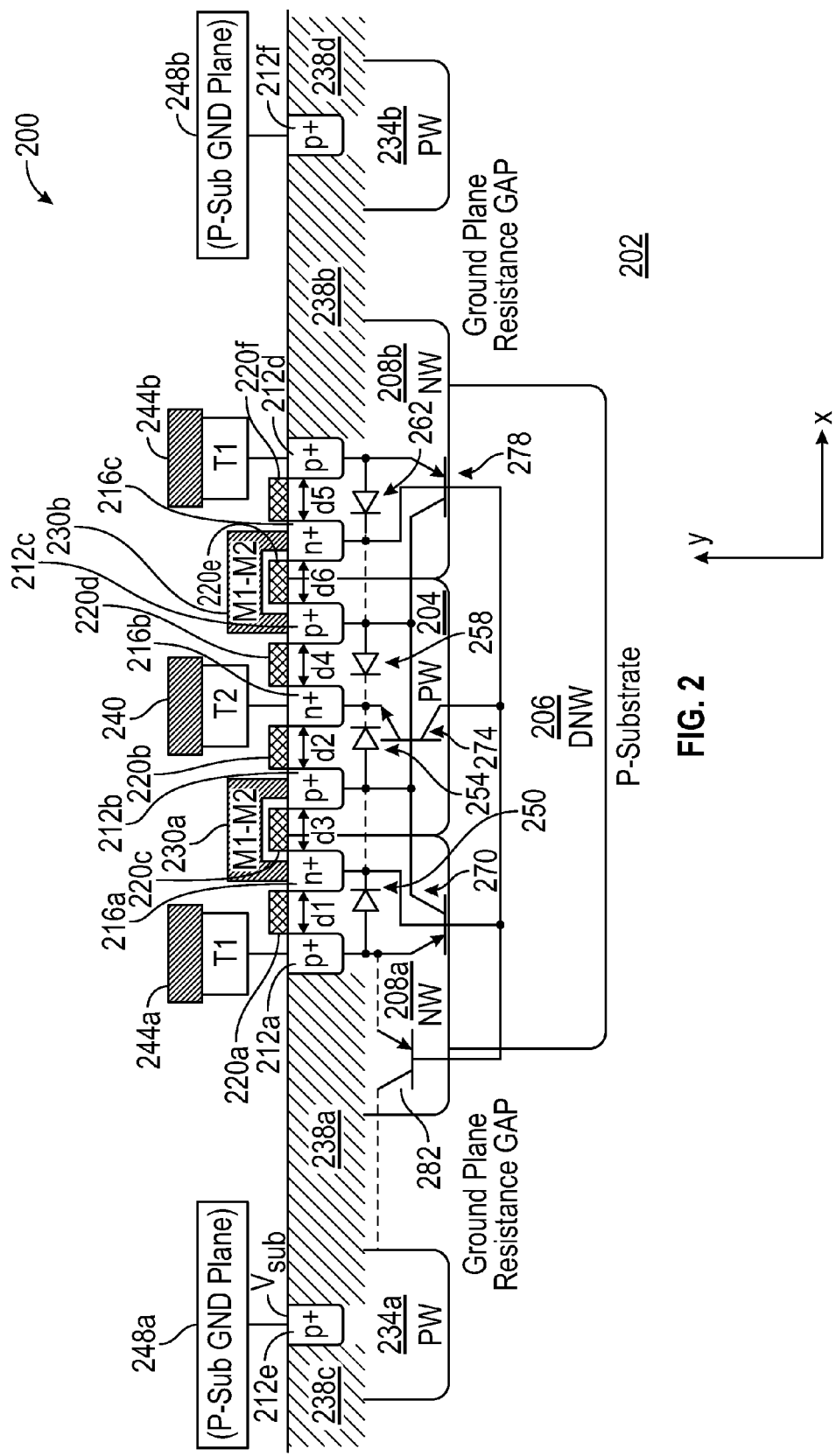
FIG. 2 is a cross-sectional view of a high speed interface protection device, according to some embodiments.
Figures 3A, 3B:
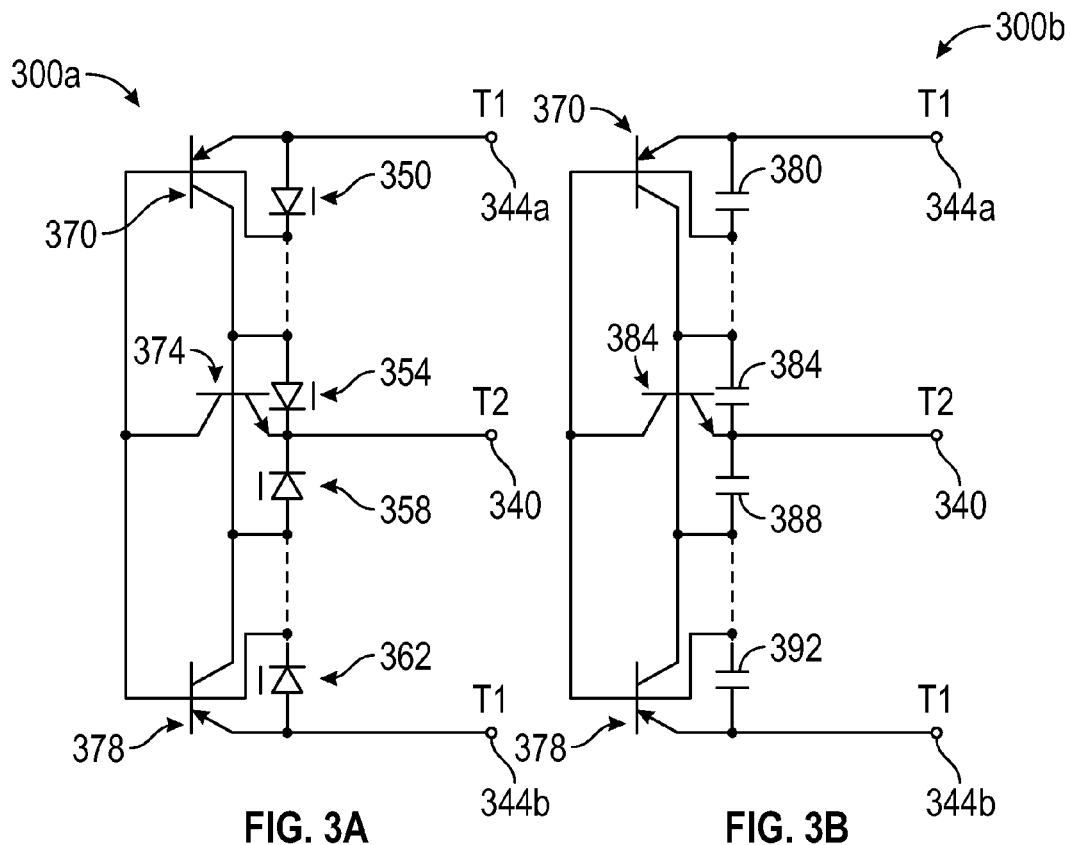
FIG. 3A is a schematic equivalent circuit diagram of the high speed interface protection device of FIG. 2, represented using equivalent diodes and transistors, according to some embodiments.
FIG. 3B is a schematic equivalent circuit diagram of the high speed interface protection device of FIG. 2, represented using equivalent capacitors and transistors, according to some embodiments.

FIG. 2 illustrates a high speed interface protection device 200 according to some embodiments. In FIG. 2, to help better understand the various structural features as they relate to the operation of the high speed interface device 200, various structural regions are overlaid with an equivalent circuit diagram. FIG. 3A shows the equivalent circuit in isolation. In the following, the various structural features are described first, followed by operation of the protection device 200 using the equivalent circuit diagram. The high speed interface protection device 200 includes a semiconductor substrate 202, e.g., a p-type semiconductor substrate, having formed therein a first P well (PW) 204 and a first N well (NW) 208a and a second N well (NW) 208b adjacent on each side of the first P well 204. In the illustrated embodiment, the first NW 208a and the second NW 208b are electrically connected and represent opposing sides of a ring structure, to laterally surround the PW 204. Other embodiments are possible, however, where the first and second NWs 208a and 208b are separate and do not surround the PW 204. In some embodiments, the first PW 204 and the first NW 208a are formed immediately adjacent to each other (e.g., contact each other), and the first PW 204 and the second NW 208b contact each other to form junction regions therebetween. In embodiments where the first NW 208a and the second NW 208b are electrically connected, e.g., to form a ring structure, the first PW 204 and the electrically connected structure formed by the first NW 208a and the second NW 208b form a single junction region therebetween.

As used herein, a junction or a junction region refers to a region formed when two semiconductor material of different types meet, and can include regions near the interface where the electronic bands (i.e., conduction and valence bands) are bent due to built-in electric fields. Thus, the dimension of a junction region can depend on various factors such as the doping concentrations and the doping profiles of the different types of semiconductor materials forming the junction.

Still referring to FIG. 2, the high speed interface protection device 200 includes a deep N well (DNW) 206 disposed below and in contact with the bottom ends of the first NW 208a, the first PW 204 and the second NW 208b. In some embodiments, the DNW 206 forms a junction region with the first PW 204 vertically in the y direction while forming extensions of the first NW 208a and the second NW 208b, such that the first NW 208a, the DNW 206 and the second NW 208b form a tub-type isolation to enclose and isolate the first PW 204 from the substrate 202.

In the first NW 208a, a first heavily doped p-type region (p$^+$) 212a and a first heavily doped n-type (n$^+$) region 216a are each formed and are laterally separated from each other in the x-direction (horizontal, or parallel to the surface of the substrate 202) by a distance $d_1$. A first electrically floating metal layer 220a is formed on a surface of the first NW 208a and extends in the x-direction between the first p$^+$ region 212a and the first n$^+$ region 216a. In the first PW 204, a second heavily doped p region (p$^+$) 212b and a second heavily doped n (n$^+$) region 216b are each formed therein, and are laterally separated from each other in the x-direction by a distance $d_2$. A second electrically floating metal layer 220b is formed on a surface of the first PW 204 and extends in the x-direction between the second p$^+$ region 212b the second n$^+$ region 216b. A third electrically floating metal layer 220c is formed on a surface of the junction region between the first NW 208a and the first PW 204 and extends in the x-direction between the first n$^+$ region 216a and the second p$^+$ region 212b. The first n$^+$ region 216a and the second p$^+$ region 212b are separated by a distance $d_3$ which includes a partial (e.g., 30% to 70%) distance in the first NW 208a and a remaining (e.g., 70% to 30%) distance in the first PW 204.

In the first PW 204, a third heavily doped p-type region (p$^+$) 212c is formed and is laterally separated from the second n$^+$ region 216b by a distance $d_4$, such that the second n$^+$ region 216b is laterally interposed in the x-direction between the second p$^+$ region 212b and the third p$^+$ region 212c. A fourth electrically floating metal layer 220d is formed on the surface of the first PW 204 and extends in the x-direction between the second n$^+$ region 216b and the third p$^+$ region 212c.

In the illustrated embodiment of FIG. 2, the second p$^+$ region 212b and the third p$^+$ region 212c are discrete highly doped regions formed in the PW 204. Other embodiments are possible, however, where the second p$^+$ region 212b and the third p$^+$ region 212c are electrically connected, e.g., to form a ring structure laterally surrounding the second n$^+$ region 216b.

Still referring to FIG. 2, in the second NW 208b, a third heavily doped n-type (n$^+$) region 216c and a fourth heavily doped p-type (p$^+$) region 212d are each formed and are laterally separated from each other in the x-direction by a distance $d_5$. A fifth electrically floating metal layer 220e is formed on a surface of the junction region between the first PW 204 and the second NW 208b and extends in the x-direction between the third n$^+$ region 216c and the third p$^+$ region 212c. The third n$^+$ region 216c and the third p$^+$ region 212c are separated by a distance $d_6$ which includes a partial distance in the first PW 204 and a remaining distance in the second NW 208b, similar to the distance $d_3$. A sixth electrically floating metal layer 220f is formed on a surface of the second NW 208b and extends in the x-direction between the third n$^+$ region 216c and the fourth p$^+$ region 212d.

In the illustrated embodiment, the first and third n$^+$ regions 216a and 216c and the first and fourth p$^+$ regions 212a and 212d are discrete highly doped regions formed in the respective wells. Alternative embodiments are possible, where the first n$^+$ region 216a and the third n$^+$ region 216c can be electrically connected to each other, e.g., to form a ring structure laterally surrounding the second p$^+$ region 212b and the third p$^+$ region 212c; the first p$^+$ region 212a and the fourth p$^+$ region 212d can be electrically connected to each other, e.g., to form a ring structure laterally surrounding the first n$^+$ region 216a and the third n$^+$ region 216c. In these embodiments, the heavily doped regions that are electrically connected to each other can have substantially the same lateral dimensions and doping profiles/concentrations.

In some embodiments, the second and fourth electrically floating metal layers 220b and 220d can be electrically connected to each other, e.g., to form a ring structure laterally surrounding the second n$^+$ region 216b; the third and fifth electrically floating metal layers 220c and 220e can be electrically connected to each other, e.g., to form a ring structure laterally surrounding the second and fourth electrically floating metal layers 220b and 220d; and the first and sixth electrically floating metal layers 220a and 220f can be electrically connected to each other, e.g., to form a ring structure laterally surrounding the second and fourth electrically floating metal layers 220b and 220d. In these embodiments, the electrically floating metal layers that are electrically connected to each other can have substantially the same lateral dimensions. As discussed above with respect to FIG. 1, the presence of the floating metal layers allows for relatively close proximity of the heavily doped (n+, p+) regions of a diode without a need to separate them with isolation regions, for reduced series resistance of the diode.

To further reduce series resistance of the diodes, the high speed interface protection device 200 additionally includes a first metallization structure 230a contacting the first n$^+$ region 216a and the second p$^+$ region 212b to form an electrical short therebetween, and a second metallization structure 230b contacting the third p$^+$ region 212c and the third n$^+$ region 216c to form an electrical short therebetween. As described infra, each of the metallization structures 230a and 230b can each include metallization lines and vias in lower metallization levels, e.g., first metallization (M1) level, second metallization (M2) level, or both M1 and M2 levels. In embodiments where the first n$^+$ region 216a and the third n$^+$ region 216c are electrically connected to each other and/or where the second p$^+$ region 212b and the third p$^+$ region 212c are electrically connected to each other, the first metallization structure 230a and the second metallization structure 230b can be electrically connected to each other.

Still referring to FIG. 2, the high speed interface protection device 200 additionally includes a second P well (PW) 234a having formed therein a fifth heavily doped p-type (p$^+$) region 212e, which is separated from the first NW 208a in the x-direction by a first isolation 238a, which is a dielectric isolation, e.g., shallow trench isolation filled with silicon oxide, and further includes a third P well (PW) 234b having formed therein a sixth heavily doped p-type (p$^+$) region 212f, which is separated from the second NW 208b in the x-direction by a second isolation 238b. The fifth p$^+$ region 212e is formed between the first isolation 238a and a third isolation 238c such that the fifth p+ region 212e does not form a PN junction region with any adjacent n-type semiconductor material. Similarly, the sixth p$^+$ region 212f is formed between the second isolation 238b and a fourth isolation 238d such that the sixth p$^+$ region 212f does not form a PN junction region with any adjacent n-type semiconductor material. In some embodiments, the fifth p$^+$ region 212e and the sixth p$^+$ region 212f can be electrically connected to each other, e.g., to form a ring structure surrounding the NW 208a, the PW 204 and the NW 208b. The substrate regions vertically below the first and third isolations 238a and 238b and laterally between the first NW 208a and the second PW 234a, and vertically below the second and fourth isolations 238b and 238d and laterally between the second NW 208b and the third PW 234b include ground plane resistance gaps, which can be native p-type regions.

The protective device of FIG. 2 has first terminals (T1) 244a/244b and a second terminal (T2) 240, and third terminals 248a/248b. The T2 240 is configured to receive a first voltage of a signal, e.g., a transient signal, and can be connected to, e.g., one of $V_{SS}$, $V_{DD}$, I/O or ground through various metallization lines and vias in one or more of the first metallization (M1) level through eighth metallization level (M8). T1 244a/244b is configured to receive a second voltage of the signal different from the first voltage and can be connected to, e.g., a different one of $V_{SS}$, $V_{DD}$, I/O or ground through various metallization lines and vias in one or more of the first metallization (M1) level through fourth metallization level (M4). Each of the third terminals 248a/248b can be connected, e.g., Kelvin-connected, to the substrate at ground. In some configurations, the T2 240 can also be connected to the substrate at ground, but not Kelvin-connected, such that under a transient electrical event, current flows primarily between T2 and T1.

As described supra, the first to sixth electrically floating metal layers 220a to 220f can advantageously allow adjacent n+ and p+ regions of a diode to be in close proximity for high current and high speed capability, in part due to not having an isolation region therebetween for minority carriers to have to diffuse and/or drift around. In the illustrated embodiment of FIG. 2, each of the first to sixth electrically floating metal layers 220a to 220f extends between a respective pair of n+ and p+ regions without substantially overlapping either of the n+ and p+ regions. For example, the first electrically floating metal layer 220a extends on the surface of the NW 208a between the first p+ region 212a and the first n+ region 216a but does not extend substantially into the first p+ region 212a nor into the first n+ region 216a themselves. In some embodiments, the electrically floating metal layers 220a-220f do not extend past the depletion regions of the respective well regions (NW 208a, PW 204, NW 208b) in which they are formed. In other embodiments, the electrically floating metal layers 220a-220f extend into the neighboring n+ and p+ regions but do not extend past the depletion regions of the n+ and p+ regions. In some embodiments, lateral dimensions of the electrically floating metal layers 220a-220f have lateral dimensions $d_1$-$d_6$ corresponding to distances between respective adjacent n+ and p+ regions.

It will be appreciated that, as described herein and throughout the specification, floating metal structures such as the first to sixth electrically floating metal layers 220a to 220f can be formed simultaneously during and using processing steps that form gate stacks of n-FETs (not shown) or p-FETs (not shown) elsewhere in the apparatus (e.g., main high speed interface circuit) that includes the protection device 200. Accordingly, in various embodiments described herein, the floating metal layers are formed on underlying thin dielectrics (e.g., $SiO_2$, SiON, or high K dielectrics) that are deposited or grown to form gate dielectrics (not shown) of the n-FETs and/or p-FETs elsewhere in the integrated circuit. Thus, while not depicted in the Figures for clarity, the floating metal layers do not directly contact the underlying surfaces of the wells on which they are formed, but are vertically interposed by a thin dielectric. In addition, while also not illustrated for clarity, sidewall spacers (e.g., SiN spacers) may be formed on sidewalls of the floating metal layers to insulate the floating metal layers from contacting the adjacent n+ and p+ regions. The underlying gate dielectric layer and sidewall spacers prevent a direct electrical short from forming between adjacent n+ and p+ regions. The thin dielectric layers prevent a silicide formation between the floating metal layers and the underlying well surfaces, and serve to electrically isolate the floating metal layers, which are not electrically connected to any other structure.

Thus, the floating metal layers may be formed simultaneously with gate stacks for MOS transistors formed elsewhere in the integrated circuit, and extra processing steps are not needed. Furthermore, the floating metal structures described herein aid to isolate adjacent diodes and lower leakage in the off state, but unlike other isolation structures (e.g., STI), allow faster response times during fast transient stress conditions. The metal floating structures, having the structure of a gate stack, can also facilitate self-aligned doping of adjacent n+ and p+ regions. As the floating metal layers are formed simultaneously with and share the same structure as gate stacks for MOS transistors elsewhere in the integrated circuit, it is also possible for the protection devices described herein to share some additional processing steps and structures. For example, the lightly doped drain (LDD) or double diffused drain (LDD) (not shown) doping structures that are typically employed in MOS transistors elsewhere in the integrated circuit can also be employed in the protection device. For short channel transistors, LDD or DDD doping structures are commonly implemented to reduce the impact of hot carrier effects, but can also contribute to drain-to-source punch-through leakage. However, because hot carrier effects are not an issue for the floating gate structures that isolate diodes in the illustrated embodiments, it is preferred to block the LDD or DDD doping in the region of the protection device, thus avoiding the punch-through effects and allowing superior performance during high stress operation.

When the metal layers are formed with the gates of n-FETs, material that can be used include n-doped semiconductors such as n-doped polycrystalline silicon or a suitable "n-type" metal having a work function $\Phi_{m,N}$ between about 4.1 eV and about 4.65 eV, between about 4.1 eV and about 4.4 eV, or between about 4.4 eV and about 4.65 eV. When the metal layers are formed with gates of p-FETs, materials that can be used include p-doped semiconductors such as p-doped polycrystalline silicon or a suitable "p-type" metal having a work function $\Phi_{m,P}$ between about 4.65 eV and about 5.2 eV, between about 4.65 eV and about 4.9 eV, or between about 4.9 eV and about 5.2 eV.

In various embodiments disclosed herein, suitable metals for the electrically floating metal layers 220a-220f in FIG. 2 include, e.g., aluminum (Al), tungsten (W), titanium (Ti), tantalum (Ta), molybdenum (Mo), rubidium (Ru), TiN, TaN, TaCN, and $TaSi_xN_y$, to name a few.

In various embodiments disclosed herein, dimensions of the first to sixth distances $d_1$-$d_6$ can be selected, in conjunction with the doping concentrations of the well and heavily doped regions, such that the resulting diodes have high current density capabilities while having high resistance to punch-through effects and band-to-band tunneling. In various embodiments, one or more of, or each of, the first to sixth distances $d_1$-$d_6$ is less than about 1 μm, less than about 0.5 μm, less than about 0.2 μm, between about 0.1 μm and about 0.3 μm, or between about 0.06 μm and about 0.2 μm, for instance about 0.16 μm.

In addition, various p+ regions and n+ region can have a peak doping concentration exceeding about $1\times10^{19}$ cm$^{-3}$, exceeding about $1\times10^{20}$ cm$^{-3}$, or in the range between about $1\times10^{20}$ cm$^{-3}$ and about $8\times10^{20}$ cm$^{-3}$, exceeding about $2\times10^{20}$ cm$^{-3}$. In addition, various PWs and NWs and the DNW have a peak doping concentration in the range of about $1.5\times10^{16}$ cm$^{-3}$ to about $7.5\times10^{16}$ cm$^{-3}$, for example, about $5.0\times10^{16}$ cm$^{-3}$.

In various embodiments, the first metallization structure 230a and the second metallization structure 230b can each have an electrical resistance between about 100 Ohms and about 1000 Ohms. In various embodiments, the first metallization structure 230a and the second metallization structure 230b can each have a net capacitance that is lower than about 100 fF, lower than about 50 fF or lower than about 30 fF, as described more in detail infra with respect to FIGS. 4A-4E.

It will be appreciated that the illustrated high speed interface protection device 200 of FIG. 2 is symmetric about the T2 240. That is, the left half of the device and the right half of the device can have similar or substantially the same physical characteristics, such that response characteristics between the T2 240 and the T1 244a are substantially the same as response characteristics between the T2 240 and the T1 244b. This can be achieved by, e.g., providing similar physical characteristics (e.g., doping parameters and physical dimensions) between features on the left side of the device 200 compared to the right side of the device 200, e.g., between first NW 208a, the first p+ region 212a, the first n+ region 216a and the second p+ region 212b on the left side of the first terminal 240 and their corresponding features second NW 208b, the fourth p+ region 212d, the third n+ region 216c and the third p+ region 212c, respectively. Such arrangements are provided when some features on the left side of the protection device 200 are electrically connected to their corresponding features on the right side to form, e.g., ring structures as described supra. However, in other embodiments, the high speed interface protection device 200 can be asymmetric, i.e., have asymmetric and independent physical characteristics.

In the following, the structural features described above will be described as they relate to active semiconductor device components (e.g., transistors and diodes) that are formed by the structural features. Still referring to FIG. 2, the left side of the high speed interface protection device 200 includes a first diode 250 which includes the first p+ region 212a, the first NW 208a and the first n+ region 216a. The first p+ region 212a is connected to the T1 244a, which can serve as an anode of the first diode 250, and the first n+ region 216a is connected to the first metallization structure 230a, which can serve as a cathode of the first diode 250. The protection device 200 additionally includes a second diode 254 which includes the second p+ region 212b, the first PW 204 and the second n+ region 216b. The second p+ region 212b is connected to the first metallization structure 230a, which can serve as an anode of the second diode 254, and the second n+ region 216b is connected to the T2 240, which can serve as a cathode of the second diode 254. As configured, the left side of the device 200 includes first serially connected diodes including the first and second diodes 250 and 254 in which the T1 244a and the T2 240 serve as an anode and a cathode, respectively. The right side of the high speed interface protection device 200 includes second serially connected diodes including the third diode 258, which includes the third p+ region 212c, the first PW 204 and the second n+ region 216b, connected in series via the second metallization structure 230b to a fourth diode 262, which includes the fourth p+ region 212d, the second NW 208b and the third n+ region 216c. As configured, the T1 244b and the T2 240 serves as an anode and a cathode of the second serially connected diodes, respectively.

It will be appreciated that by electrically shorting via the first metallization structure 230a the cathode of the first diode 250 and the anode of the second diode 254, the first diode 250 and the second diode 254 form serially connected PN diodes that are fully integrated with low series resistance, because the first n+ region 216a and the second p+ region 212b form Ohmic contacts with the metallization structure 230a. The PN diodes connected in this way are to be distinguished from two back-to-back PN junctions without the electrically shorting metallization structure. Similarly, the cathode of the fourth diode 262 and the anode of the third diode 258 are electrically shorted to each other via the second metallization structure 230b, which is to be distinguished from two back-to-back PN junctions without an electrically shorting metallization structure. The first and second serially connected diodes described above provide fast protection with very low series resistance. However, the serially connected diodes may not be capable of sustaining voltages and currents substantially in excess of saturation current voltages and currents, and may even be damaged when subject to such conditions. To provide further protection under such conditions, the protection device 200 additionally includes built-in silicon-controlled rectifier devices, as described infra.

Still referring to FIG. 2, the high speed interface protection device 200 additionally includes a first PNP bipolar transistor (BJT) 270 which includes the first p+ region 212a configured as an emitter, the first NW 208a and the DNW 206 configured as a base, and the first PW 204 configured as a collector. The high speed interface device 200 additionally includes a first NPN bipolar transistor (BJT) 274, which can be a bi-directional bipolar transistor, which includes the second n+ region 216b configured as an emitter, the first PW 204 configured as a base, and the DNW 206 configured as a collector. The high speed interface device 200 additionally includes a second PNP bipolar transistor (BJT) 278, which includes the fourth p+ region 212d configured as an emitter, the second NW 208b and the DNW 206 configured as a base, and the first PW 204 configured as a collector. It will be appreciated that the collector of the first PNP BJT 270 is connected to the base of the first NPN BJT 274, and the collector of the first NPN BJT 274 is in turn connected to the base of the first PNP BJT 270, whose effects will be described more in detail with respect to FIG. 3A, infra. Similarly, it will be appreciated that the collector of the second PNP BJT 278 is connected to the base of the first NPN BJT 274, and the collector of the first NPN BJT 274 is in turn connected to the base of the second PNP BJT 278. The high speed interface protection device 200 additionally includes a second NPN bipolar transistor (BJT) 282, whose base is connected to the base of the first PNP BJT 270 and further connected to the collector of the first NPN BJT 274.

With reference to FIGS. 3A and 3B, operational principles of a high speed interface protection device 300a/300b are described using equivalent circuit representations of a high speed interface protection device similar to the protection device 200 described above with respect to FIG. 2. As described above with respect to FIG. 2, the protection device 300a/300b provides two current shunt paths, a first current shunt path through a network of diodes and a second current shunt path through a network of transistors. In some embodiments, the two current paths can be configured such that one of the two shunt paths, e.g., the first current shunt path, is triggered before the other of the two shunt paths, and the other of the two current shunt paths, e.g., the second current path, is triggered after the first current shunt path is triggered to prevent excessive current flowing through the first shunt path, such that the protection device 300a/300b itself has protection against damage. In the following, the first current shunt path though the network of diodes is described first, followed by the second current shunt path through the network of transistors.

Referring to the network of diodes in FIG. 3A, the first high current shunt paths are provided by a first diode 350 and a second diode 354 forming the first serially connected diodes, and a third diode 358 and a fourth diode 362 forming the second serially connected diodes. The first serially connected diodes 350/354 can have a first threshold voltage $V_{TH1}$ that is about equal to the combined threshold voltages of the first diode 350 and the second diode 354, and the second serially connected diodes 358/362 can have a second threshold voltage $V_{TH2}$ that is about equal to the combined threshold voltages of the third diode 358 and the fourth diode 362. The high speed interface protection device 300a can be configured to provide a first current shunt path in response to a transient electrical event that induces a voltage difference between first terminals (Ti) 344a/344b and a second terminal (T2) 340 that exceeds a particular value. For example, when the T2 340 is connected to an I/O, the T2 344a/344b can be connected to $V_{SS}$ or ground (e.g., substrate), or when the T2 340 is connect to $V_{SS}$, $V_{DD}$ or ground (e.g., substrate), the T1 can be connected to an I/O, such that a transient electrical event can induce a voltage difference between the T2 340 and the T1 344a/344b that exceeds the threshold voltages of the first and/or second serially connected diodes, thereby providing a low resistance shunt path though the first and/or second serially connected diodes.

Referring to the network of transistors in FIG. 3A, the second high current shunt path is provided by a first PNP bipolar transistor (BJT) 370, a first NPN bi-directional BJT 374, and a second PNP BJT 378 arranged in a PNPNP bipolar silicon rectifier (SCR) configuration.

Still referring to FIG. 3A, the T1 344a is electrically connected to the PNPNP SCR device through the emitter of the first PNP BJT 370. The collector of the first PNP BJT 370 is electrically connected to a base of the NPN BJT 374. The first PNP BJT 370 further includes a base electrically connected to a collector/emitter (C/E) of the bidirectional NPN BJT 374. In addition, the T1 344b is electrically connected to the PNPNP SCR device through the emitter of the second PNP BJT 378. The collector of the second PNP BJT 378 is electrically connected to the base of the NPN BJT 374. The second PNP BJT 378 further includes a base electrically connected to the C/E of the NPN BJT 374.

In operation, when a transient electrical event induces a voltage difference between the T2 340 and the T1 344a/344b that is greater than a certain trigger voltage $V_{TR}$, the bipolar PNPNP SCR device can be triggered. The PNPNP device can be triggered in either voltage polarities because the combination of the first PNP BJT 370 and the NPN BJT 374 can operate as a first cross-coupled PNPN SCR configured to be triggered by a first voltage at a first polarity, and the combination of the second PNP BJT 378 and the NPN BJT 374 can operate as a second cross-coupled PNPN SCR configured to be triggered by a second voltage at a second polarity.

In the illustrated embodiment, the first cross-coupled PNPN SCR comprises a first P-region comprising the emitter of the first PNP BJT 370, a first N-region comprising the base of the first PNP BJT 370 connected to the collector of the bidirectional NPN BJT 374, a second P-region comprising the collector of the first PNP BJT 370 connected to the base of the NPN BJT 374, and a second N-region comprising the collector/emitter (C/E) of the NPN BJT 374. In one aspect, the second P-region, the first P-region, and the second N-region correspond to a "gate," an "anode," and a "cathode," respectively, of the first PNPN SCR. The first PNPN SCR can be turned on or "triggered" when a positive voltage signal is applied to the gate relative to the cathode of the first PNPN SCR. This can occur, for example, when a transient electrical event induces a negative voltage on the T2 340 relative to the T1 344a (or alternatively, a positive voltage on the T1 344a relative to the T2 340) that exceeds a certain $V_{TR1}$ in absolute value. When this occurs, the first PNP BJT 370 starts to conduct. When the first PNP BJT 370 starts to conduct, its collector potential is pulled down, which in turn pulls down the base potential of the bidirectional NPN BJT 374. This in turn causes the bidirectional NPN BJT 374 to conduct. When the NPN BJT starts to conduct, its collector potential is pulled up, which in turn pulls up the base potential of the first PNP BJT 370. In this way, there can be a positive feedback that reinforces the conducting states of the first PNP BJT 370 and the bidirectional NPN BJT 374. The second cross-coupled PNPN SCR comprising a first P-region comprising the emitter of the second PNP BJT 378, a first N-region comprising the base of the second PNP BJT 378 connected to the collector/emitter (C/E) of the bidirectional NPN BJT 374, a second P-region comprising the collector of the second PNP BJT 378 connected to the base of the bidirectional NPN BJT 374, and a second N-region comprising the collector/emitter (C/E) of the NPN BJT 374 connected to the base of the second PNP BJT 378, can operate in a similar way, and can be triggered by a positive voltage on the T1 344b relative to the T2 340, or a negative voltage on the T2 relative to the T1 344b that exceeds a certain $V_{TR2}$ in absolute value.

Once the PNPNP SCR device is triggered as described above and enters into a low impedance state, it can be maintained by a feedback loop formed between one of the first and second PNP BJTs 370 and 378 and the bi-directional NPN BJT 374, even if the absolute voltage across the T2 340 and T1 344a/344b subsequently falls below positive the triggering voltage $V_{TR1}$.

As described above, the protection device 300a can provide two current paths, a first shunt path through the first and/or second serially connected diodes and a second shunt path through first and/or second PNPN SCRs, where each shunt path can be triggered by a voltage signal between the T2 340 and T1 344a/344b. Depending on the relative activation voltages ($V_{TH1}$ or $V_{TH2}$ of the serially connected diodes or $V_{TR1}$ or $V_{TR2}$ of the SCRs), one path can be activated before the other. In some embodiments, the $V_{TH}$'s of the serially connected diodes are lower than the $V_{TR}$'s of the SCRs such that the first path can be activated before the second path. Subsequently, the second path can be activated to protect the components (e.g., diodes) in the second path from being damaged. In other embodiments, the $V_{TH}$'s of the serially connected diodes are higher than the $V_{TR}$'s of the SCRs such that the second path can be activated before the first path. In various embodiments, $V_{TH1}$ and $V_{TH2}$ of the serially connected diodes can be in the range between about 0.5 V and about 1.4 V, between about 0.6 V and about 1.2 V, for instance about 0.8 V. In various embodiments, $V_{TR1}$ or $V_{TR2}$ of the SCRs can be in the range between about 0.3 V and about 3.0 V, between about 0.5 V and about 2.0 V, for instance about 1.0 V.

FIG. 3B represents an equivalent circuit of FIG. 3A in which the network of diodes are represented by a network of capacitors. In operation, serially connected first and second diodes 350 and 354 can be represented as serially connected first and second capacitors 380 and 384, respectively, and serially connected third and fourth diodes 358 and 362 can be represented as serially connected third and fourth capacitors 388 and 392, respectively. For comparable voltages between the T2 340 and the T1 344a/344b of FIG. 3A/3B, the net capacitance can be greatly reduced compared to those between first and second terminals 124 and 128a/128b of FIG. 1, as will be described infra.

It will be appreciated that the high speed interface protection device 300a/300b described above with respect to FIGS. 3A/3B can have the T2 340, the T1 344a/344b that are electrically connected in different configurations. In some implementations, for example, the T2 340 is connected to I/O while each of the T1 344a and T1 344b is connected to $V_{SS}$. In other implementations, for example, the T2 340 is connected to $V_{DD}$ while each of the T1 344a and the T1 344b is connected to I/O.

Figure 3C:
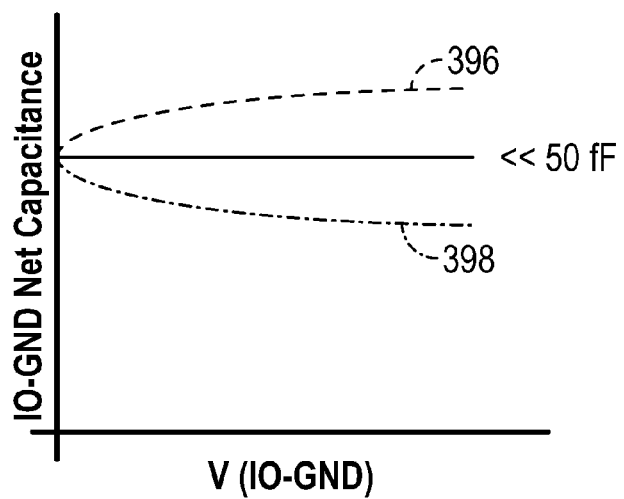
FIG. 3C is a schematic graph of capacitance versus voltage response of a high speed interface protection device, according to some embodiments.

The inventors have found that the high speed interface protection devices described herein, e.g., the device 300a/300b, advantageously exhibit relatively low net capacitances between the T2 340 and T1 344a/344b, and relatively high degree of linearity of the net capacitances, as illustrated in FIG. 3C. Net capacitance values measured between, e.g., an I/O terminal and ground, when measured at zero voltage, is less than 100 fF, less than 50 fF, or less than 30 fF, according to various embodiments disclosed herein.

In addition, as illustrated in FIG. 3C, the net capacitance demonstrates little variation over voltage, which relates to changes in the magnitude of deviation from the initial net capacitance at or near zero volts. For example, referring back to FIGS. 3A/3B, in the case where T2 340 is connected to I/O, the net capacitance 398 may decrease with increasing IO-to-ground voltage, and when T1 344a/344b is connected to I/O, the net capacitance 396 may increase with increasing IO-ground voltage. When T1 is connected to IO, T2 can also be connected to the power-high (Vdd) power supply, as will be described infra. In either configuration (FIG. 3A or FIG. 3B), the deviation relative the initial net capacitance remains relatively small. Furthermore, in configurations where two devices such as the device 300a/300b of FIGS. 3A/3B are connected in an anti-parallel configuration, a first deviation relative to the initial net capacitance of one of the two devices may compensate for a second deviation relative to the initial net capacitance of the other of the two devices over an operating voltage, resulting in a net-linearization effect whereby a net deviation of the two devices in anti-parallel configuration is smaller relative to the first and second deviations of the individual devices taken alone. In the following, with reference to FIGS. 4A-4E, metallization structures that enable such low net capacitance and high linearity of the net capacitance are described.

FIGS. 4A-4D illustrate a high speed interface protection device 200, similar to the device described above with respect to FIG. 2, with detailed view of the metallization structures that enable a low (less than 1 Ohm) equivalent series resistance (ESR), very low (less than 50 fF) net capacitance and a very high degree of linearity of the net capacitance (less than 10% deviation from the initial net capacitance), resulting in minimum RC delay suitable for high speed RF applications. In the illustrated embodiments, such electrical performance results are achieved by a combination of lateral/horizontal process architectural features of the metallization structures including a plurality of low resistance metal fingers to reduce resistance in forming the metallization structures for at least one of the terminals (e.g., T1, T2) of the protection device, while minimizing parasitic net capacitance by maximizing spacing between adjacent metallization structures. In the following, FIG. 4A and FIGS. 4B-4D represent a plan view and various cross-sectional views, respectively, of the high speed interface protection device 200, according to embodiments. It will be understood that, while the structural features of the metallization structures are described herein with respect to the device 200 that is similar to the device described above with respect to FIG. 2, the concepts of the illustrated metallization structures can be applied to any of the embodiments disclosed herein.

Referring to FIGS. 4A-4D, the metallization process architecture of the device 200 includes first (M1) through eighth (M8) metallization levels 404 (M1), 408 (M2), 412 (M3), 416 (M4), 420 (M5), 424 (M6), 428 (M7) and 432 (M8). As used herein, a metallization level includes laterally extending conductive structures formed of conductive materials, e.g., Cu, Al, W, Si to name a few, e.g., metal lines, that are patterned using a lithography mask, and also includes vertically extending conductive structures such as vias or contacts formed of conductive materials such as, e.g., Cu, Al, W or Si to name a few, that are immediately below the laterally extending conductive structures. Thus, the first metallization level (M1) 404 includes the lowest level metal lines above the substrate 202 and vias or contacts made to an n+ or a p+ region (e.g., self-aligned silicide or "salicided" contacts), within a PW or an NW. Similarly, M2 408 includes next higher level of metal lines above the M1 404 and vias or contacts made to the M1 404. M3 412 to M8 432 are similarly defined to include both lateral lines and vertical connections below them.

Figure 4B:
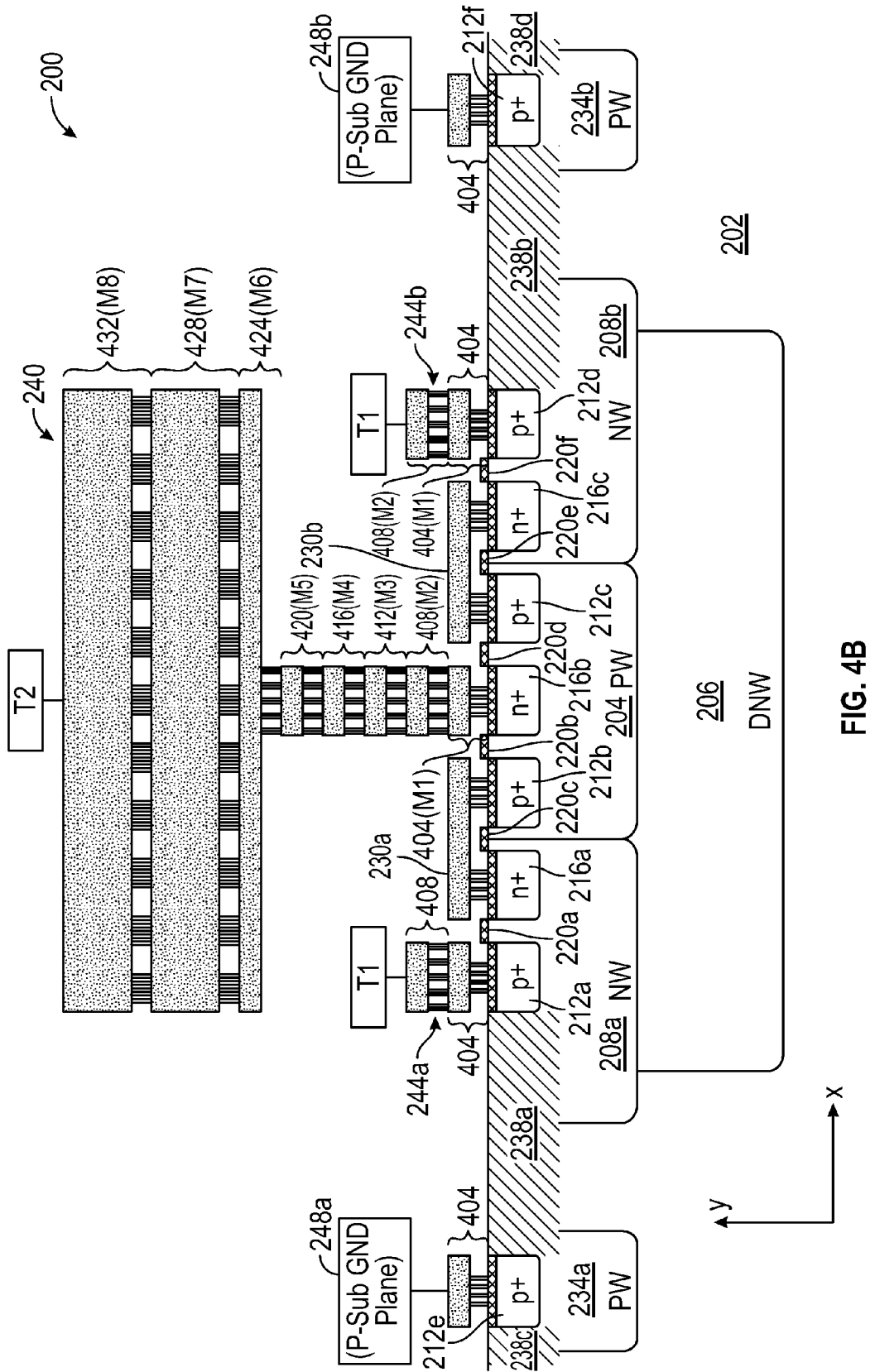
FIG. 4B is a cross-sectional view of the high speed interface protection device of FIG. 4A through the section indicated as FIG. 4B on the plan view of FIG. 4A, according to some embodiments.

In FIG. 4A, for clarity purposes, only some semiconductor regions described above with respect to FIG. 2 are illustrated. The device 200 includes a PW 234 configured as a continuous rectangular ring structure laterally enclosing and surrounding a ground plane resistance gap, which in turn encloses and surrounds an active area which includes the serially connected diodes and the built-in SCR devices described above with respect to FIG. 2. As described herein, an active area is defined by the area of the substrate in which active devices are built, which can be bounded by active area-defining isolation regions, e.g., dielectric isolation regions such as shallow trench isolations (STIs). In the illustrated embodiment, the active area is defined by isolations 238a and 238b in the x-direction (FIG. 4B), between isolations 238e and 238f in the y-direction (FIG. 4C) and between isolations 238i and 238j in the y-direction (FIG. 4D). All of the isolations can be connected to one another in a ring encompassed by the PW 234. Also laterally enclosed by the PW 234 are deep N well (DNW) 206 and NW 208. In the illustrated embodiment, the NW 208 is configured as rectangular ring structure and laterally surrounds and encloses the PW 204 (FIGS. 4A-4D). However, embodiments are not so limited. With respect to the embodiment described above with respect to FIG. 2, the first NW 208a and the second NW 208b of the device 200 of FIG. 2 correspond to opposing sides of the ring structure of the NW 208 in the x-direction. Similarly, the second PW 234a and the third PW 234b correspond to opposing sides in the x-direction of PW 234 of FIG. 4A that is configured as a rectangular ring structure.

Figure 4C:
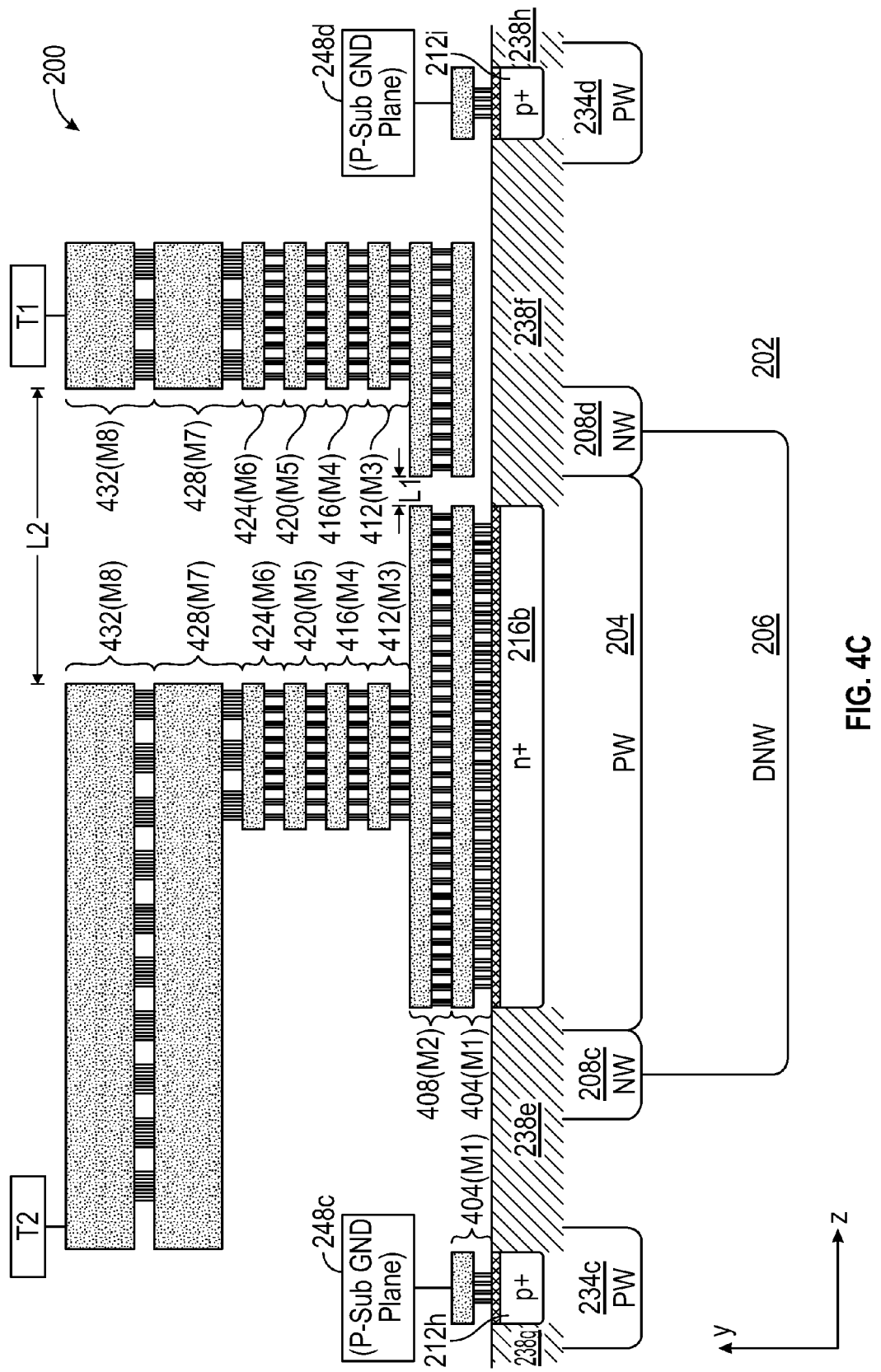
FIG. 4C is a cross-sectional view of the high speed interface protection device of FIG. 4A through the section indicated as FIG. 4C on the plan view of FIG. 4A, according to some embodiments.
Figure 4D:
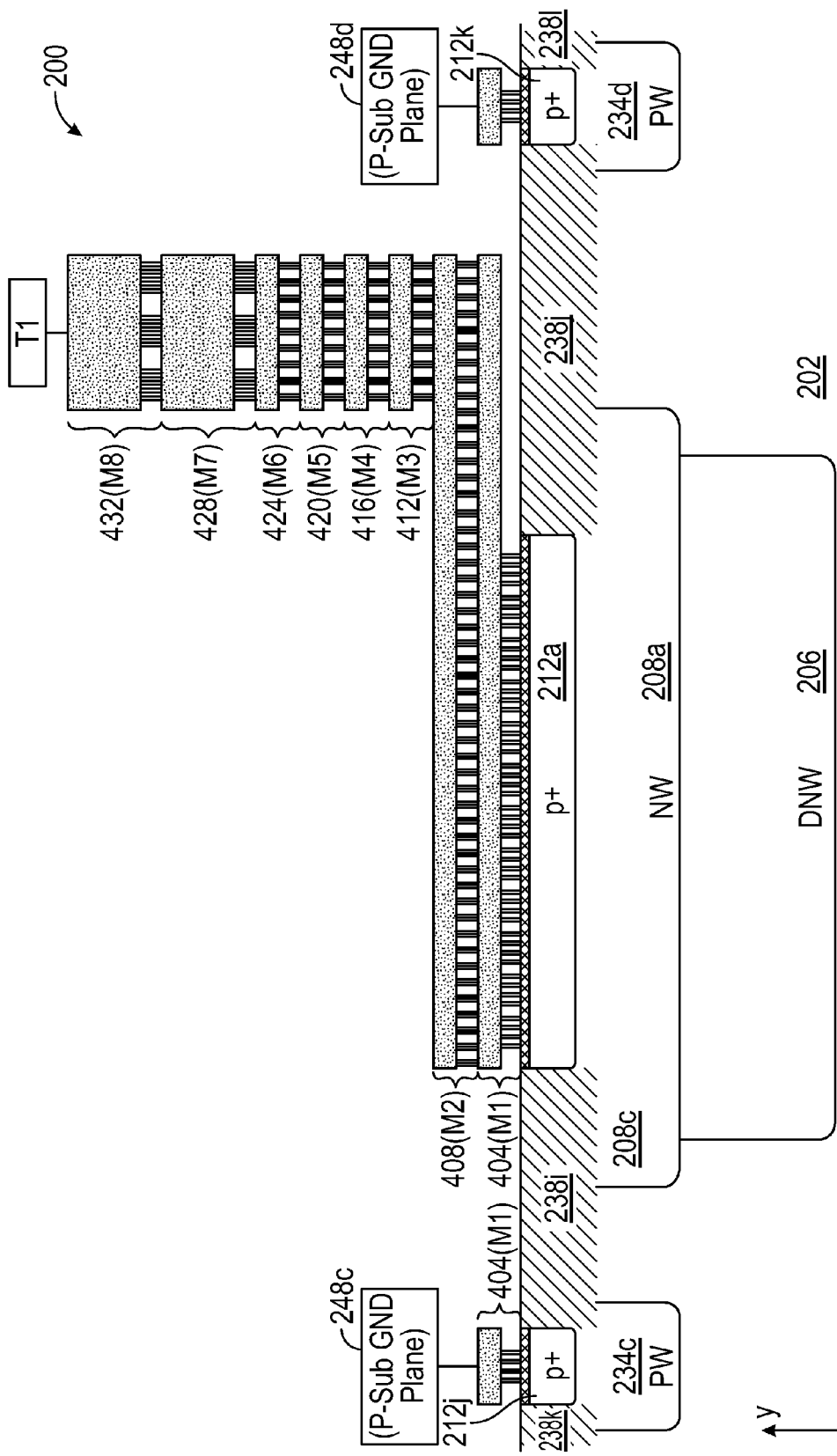
FIG. 4D is a cross-sectional view of the high speed interface protection device with reduced capacitance of FIG. 4A through the section indicated as FIG. 4D on the plan view of FIG. 4A, according to some embodiments.

Referring to FIGS. 4A-4D, the device 200 includes a first terminal T1 (corresponding to the first terminals 244a/244b of FIG. 2), which includes a plurality (two illustrated) of laterally strapped fingers 244a' and 244b' formed in M1 404 and M2 408 and extending in the z-direction over the active area. The strapped fingers 244a'/244b' are connected to upper metallization structures formed in M3 412 to M8 432 at strapping regions (FIGS. 4C and 4D). The device 200 additionally includes the second terminal T2 (corresponding to the second terminal 240 of FIG. 2), which includes one or more fingers 240' (one illustrated) formed in M1 303 and M2 408 that are laterally interposed between the first and second metallization structures 230a and 230b and between the two fingers 244a' and 244b' of T1. The finger(s) 240' of T2 is (are) vertically connected to upper metallization structures formed in M3 412 to M8 432 directly over the active area (see FIG. 4B). Each of the fingers 240', 244a' and 244b' has a width in the x-direction between about 1 μm and about 10 μm, between 2.5 μm and about 7.5 μm, for instance about 5 μm. The device 200 additionally includes substrate-to-ground plane metallization 248 configured as a continuous rectangular ring structure laterally enclosing and surrounding the ground plane resistance gap, which in turn encloses and surrounds the active area.

FIGS. 4B-4D represent cross-sections made in the x-direction through the active area viewed in the z-direction, in the y-direction through the n+ region 216b viewed the x-direction, and in the y-direction through the p+ region 212a viewed in the x-direction, respectively, of the device 200. In the illustrated embodiment, the metallization structures 230a and 230b can be formed exclusively in M1 404 through self-aligned silicided (salicided) contacts to the respective n+ and p+ regions, such that the series resistance of the serially connected diodes is minimized. The fingers of T1 244*a*' and 244*b*' formed in the M1 404 and the M2 408 are elongated and extend in the z-direction over the active area, are laterally strapped in the M1 404 and M2 408, and vertically connect to higher level metals M3 412 to M8 432 outside of the active area, e.g. over the isolations 238*f*/238*i* (FIGS. 4C and 4D). This process architecture allows the finger(s) 240' of T2, formed in the M1 404 and the M2 408, which is (are) also elongated and extend in the z-direction over the active area, to be vertically connected and routed out using higher level metals M3 412 to M8 432, between the two T1 fingers (FIGS. 4B and 4C). The illustrated process architecture advantageously allows for minimization of parasitic capacitance arising from the metal lines by, as illustrated in FIG. 4C, limiting the T1 fingers 244*a*'/244*b*' and the T2 finger(s) 240' to the lowest metallization levels (M1 404 and the M2 408), and a minimizing the distance between the T1 fingers 244*a*'/244*b*' and the T2 finger(s) 240', defined by the gap L1 between the strapping region (structures over isolation 238*f*) of the T1 fingers 244*a*'/244*b*' and the T2 finger(s) 240'. The spacing can be L1 kept below 2 μm, 1 μm or 0.5 μm, for instance about 0.4 μm. At the same time, a minimum distance L2 between upper metallization structures (M3 412-M8 432) is substantially larger, e.g., at least 2× greater than L1, 5× greater than L1 or at least 10× greater than L1. This process architecture minimizes the overall net parasitic capacitance because the heights of the metal lines increase with increasing metallization levels and, as illustrated, the upper metallization levels are spaced apart by L2 such that their contribution to the net capacitance is minimized. Simultaneously, having multiple fingers of T1, e.g., 244*a*' and 244*b*', results in a lower resistance. As a net result, overall RC delay is significantly reduced, leading to fast response of the high speed protection device.

Figure 4E:
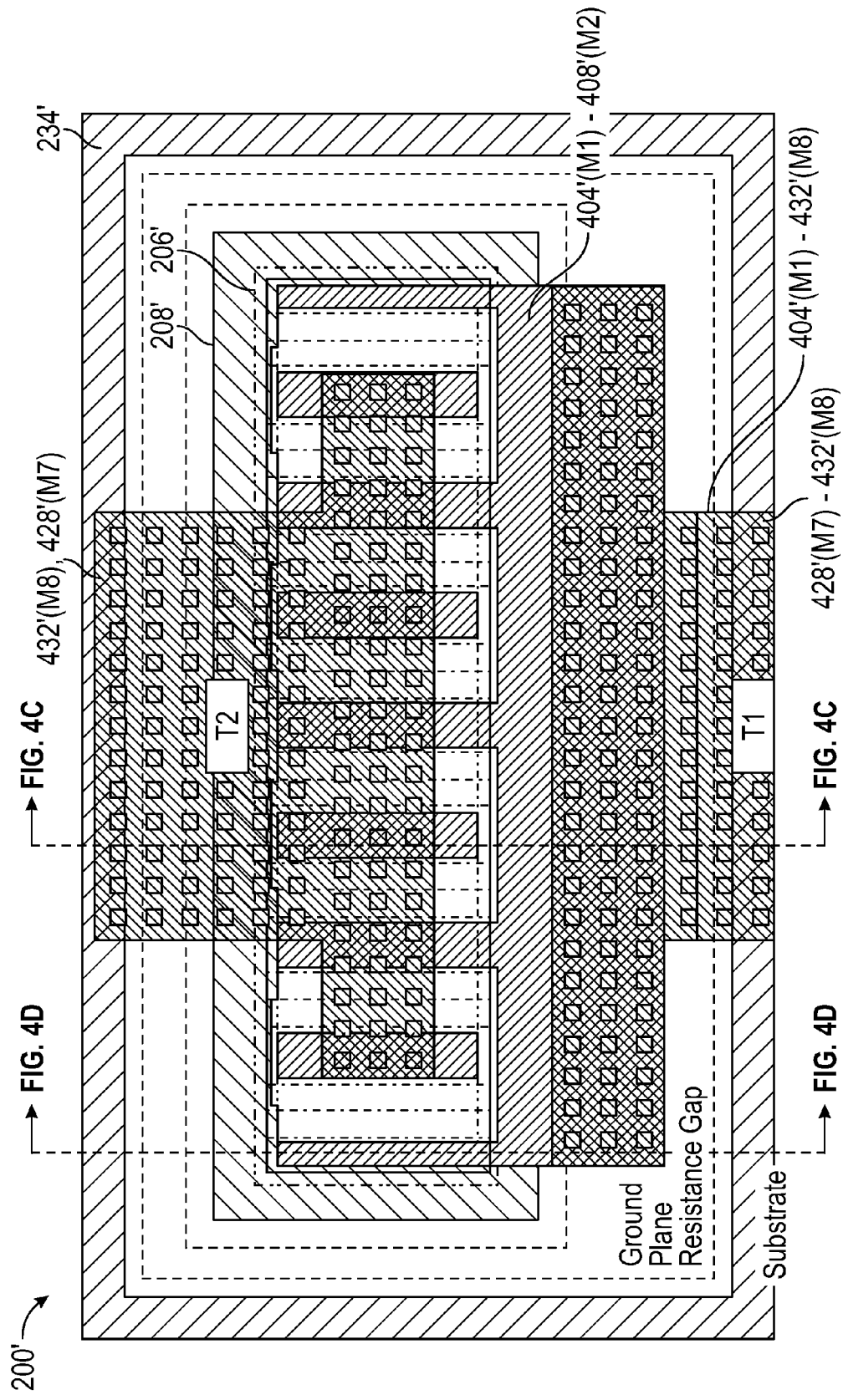
FIG. 4E is a schematic plan view illustrating multiple levels of device layout of another high speed interface protection device, to which the cross sections of FIGS. 4B-4D also apply, according to some other embodiments.

The concepts illustrated in FIGS. 4A-4D can be extended to devices having additional well regions and additional fingers of both T1 and T2, which can include additional diodes as part of serially connected diodes described supra with respect to FIGS. 4A-4D. This concept is illustrated in FIG. 4E, in which like numerals with a "prime" symbol designate analogous components relative to FIGS. 4A-4D. FIG. 4E illustrates a device 200,' which is similar to the device 200 of FIGS. 4A-4D, except that instead of one PW 204 laterally surrounded by NW 208*a* and NW 208*b* (FIG. 4B), there can be additional alternating PWs and NWs on the left side of NW 208*a* in the x-direction and alternating PWs and NWs on the right side of NW 208*b* in the x-direction, such that a suitable number of diodes and fingers of both T1 (5 illustrated) and T2 (4 illustrated) are formed, where the fingers of T2 and T1 are strapped in a similar manner to those described with respect to FIGS. 4A-4D. These types of devices are illustrated infra with respect to FIGS. 17 and 18A/18B.

Figure 5:
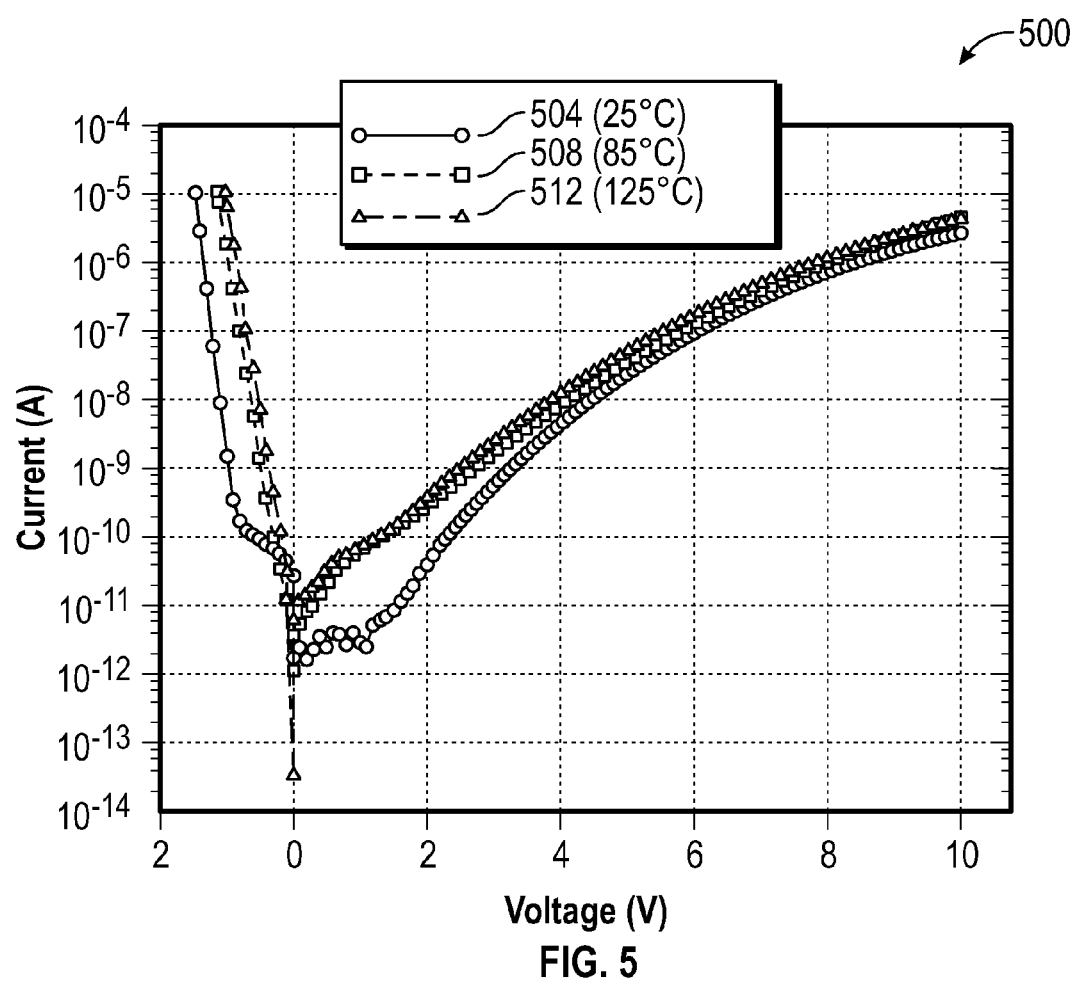
FIG. 5 is a graph of DC current-voltage (IV) characteristics measured on a high speed interface protection device according to some embodiments.

FIG. 5 is a graph 500 of DC current-voltage (IV) characteristics measured from a high speed interface protection device similar to the device illustrated with respect to FIG. 2, according to some embodiments. DC IV characteristics 504, 508 and 512 correspond to DC IV characteristics measured at 25° C., 85° C., and 125° C., respectively. It will be appreciated that, as illustrated, at an operating condition of about +4V corresponding to a reverse bias on the serially connected diodes described above with respect to FIG. 2, a leakage current measured between a second terminal (T2), e.g. at IO, and a first terminal (T1), e.g., at $V_{SS}$, remains below 50 nA at the measured temperatures. On the other hand, current under a negative voltage increases rapidly above ten microamps at a relatively low voltage (e.g., less than about −1.5V), thereby enabling high current capability under forward bias of the serially connected diodes.

Figure 6A:
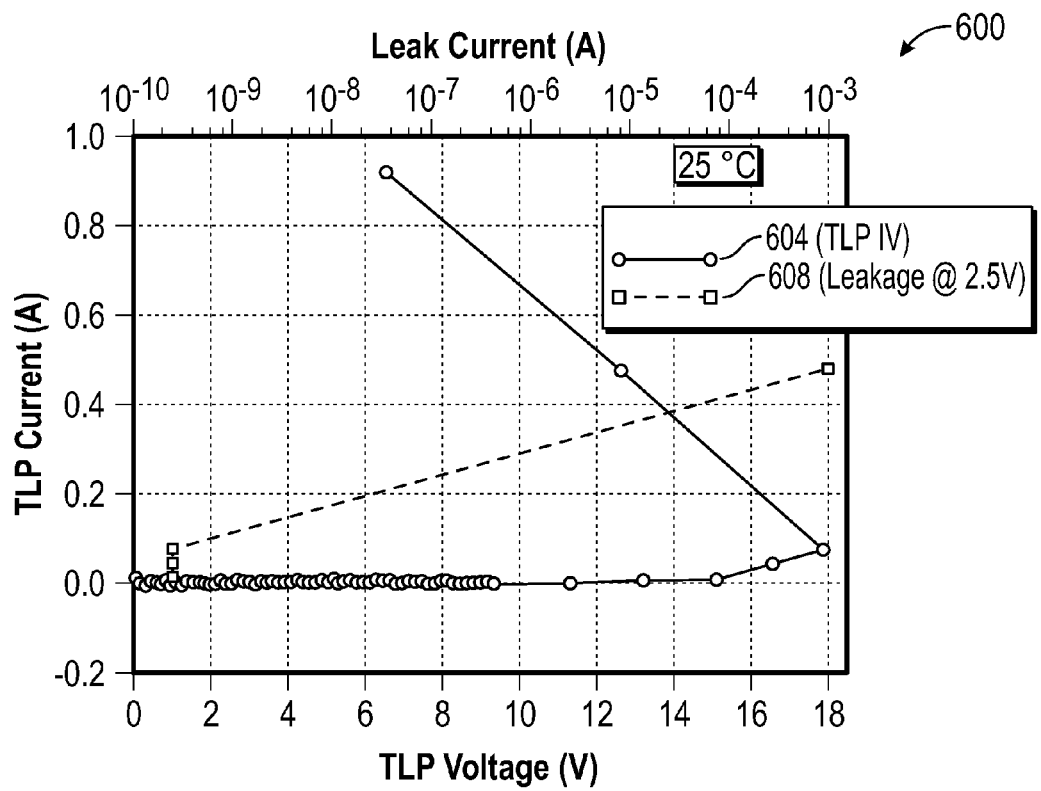
FIG. 6A is a graph of a pulsed current-voltage (IV) and the corresponding leakage current, measured at 25° C. on a high speed interface protection device according to some embodiments.
Figure 6B:
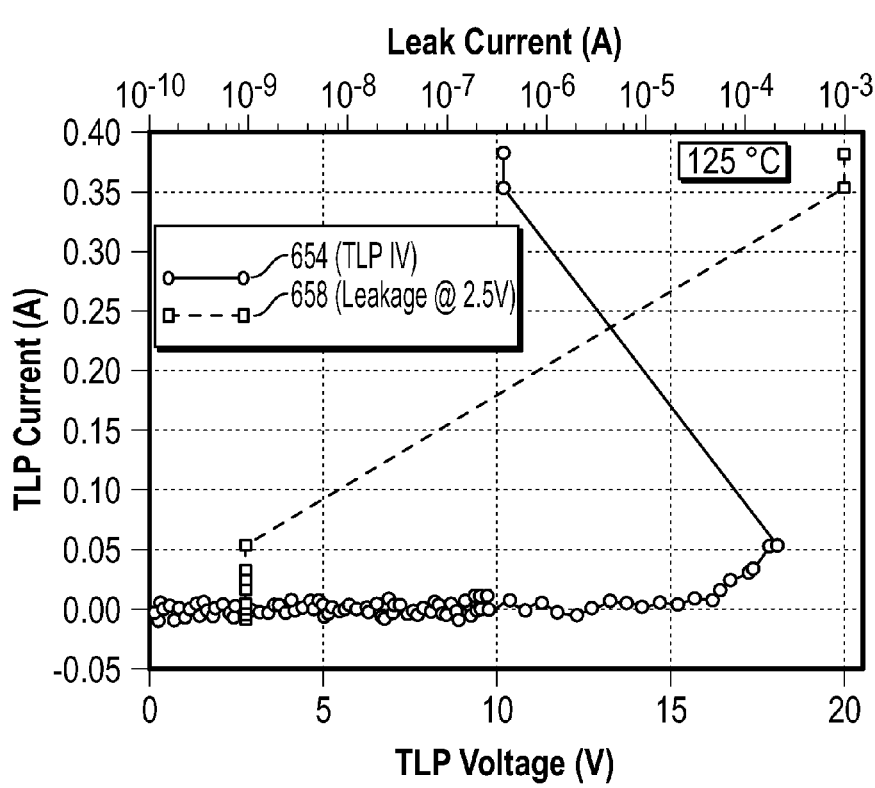
FIG. 6B is a graph of a pulsed current-voltage (IV) and the corresponding leakage current, measured at 125° C. on a high speed interface protection device according to some embodiments.

FIGS. 6A and 6B are graphs 600 and 650 plotting transmission line pulsed (TLP) current-voltage (IV) characteristics 604 and 654 measured at 25° C. and at 125° C., respectively, from a reverse-biased high speed interface protection device similar to the device 200 of FIG. 2, according to some embodiments. The TLP IV characteristics 604 and 654 were induced using a pulse having 300 ps rise time and 100 ns pulse width, and measured under a positive voltage between the second terminal (T2) and the first terminal (T1). It will be appreciated that testing under TLP-pulsed conditions enables measurements, e.g., breakdown characteristics of the device under reverse bias, under high voltage conditions that may not be possible to achieve under non-pulsed conditions. This is because, under non-pulsed conditions, the current flowing at the high voltage conditions can be high enough to damage the device. By ensuring that the reverse bias breakdown voltage of the device under TLP-pulsed conditions is sufficiently higher than normal operating voltages, a designer can build in a margin of protection. As illustrated, the pulsed IV characteristics 604 and 654 indicate that a reverse bias breakdown voltage of the device exceeds 15 V at temperatures of 25° C. and 125° C.

Still referring to FIGS. 6A and 6B, the graphs 600 and 650 additionally plot DC leakage current-voltage (IV) characteristics 608 and 658 measured at 25° C. and at 125° C., respectively, at 2.5V. The leakage IV characteristics 608 and 658 were measured after subjecting the device to the transmission line pulsed (TLP) conditions described above. It will be appreciated that the leakage IV characteristics 608 and 658, which are monitored after the TLP stress, indicate that the device has not been damaged by the TLP stress. A relatively rapid change in leakage current can be an indication that the device has reached a maximum sustainable current capability at the previously recorded TLP pulse. In the illustrated measurements of FIGS. 6A and 6B, the maximum sustainable current under reverse bias is observed to be around 50 mA.

Figure 7A:
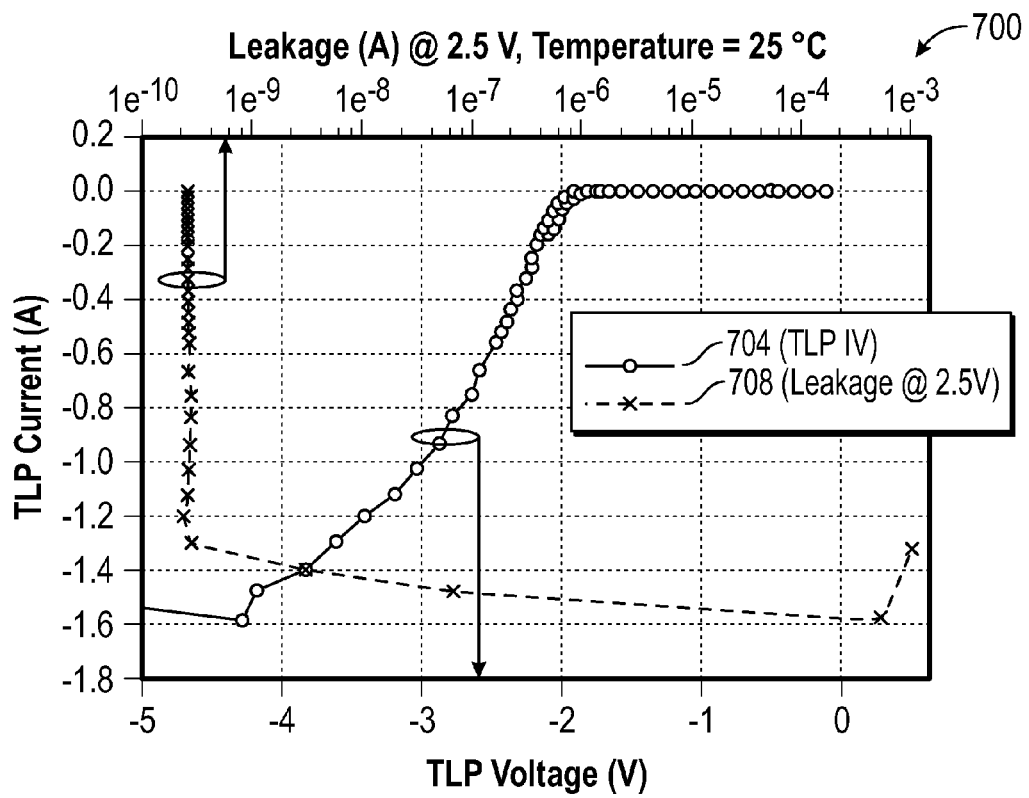
FIG. 7A is a graph of a negative-pulsed current-voltage relationship and the corresponding leakage current, measured at 25° C. on a high speed interface protection device according to some embodiments.
Figure 7B:
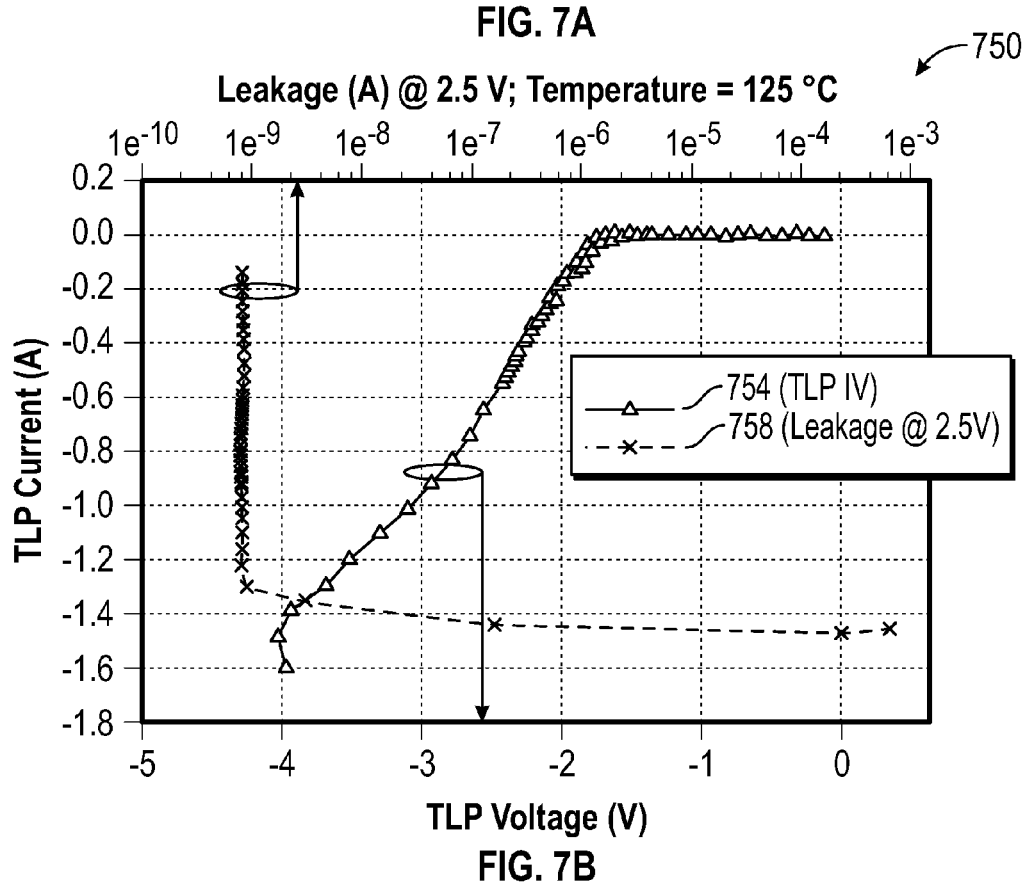
FIG. 7B is a graph of a negative-pulsed current-voltage relationship and the corresponding leakage current, measured at 125° C. on a high speed interface protection device according to some embodiments.

FIGS. 7A and 7B are graphs 700 and 750 plotting transmission line pulsed (TLP) current-voltage (IV) characteristics 704 and 754 measured at 25° C. and at 125° C., respectively, from a forward-biased high speed interface protection device similar to the device 200 described above with respect to FIG. 2, under similar conditions as described above with respect to FIGS. 6A and 6B, according to some embodiments. The TLP IV characteristics 704 and 754 were measured using a pulse having a similar rise time and pulse width (300 ps rise time and 100 ns pulse width) as that used to measure the TLP IV characteristics of FIGS. 6A and 6B, but under an opposite polarity (positive voltage between the first terminal (T1) and the second terminal (T2)). The illustrated TLP IV characteristics under forward-biased conditions demonstrate a high current capability of the device. As illustrated, the device exhibits a current handing capability of about 1.3 A or higher, which is a typical current handling capability level benchmarked with industry standard of 2,000 V human body model stress conditions at the integrated circuit level.

Still referring to FIGS. 7A and 7B, the graphs 700 and 750 additionally plot DC leakage current-voltage (IV) characteristics 708 and 758 measured at 25° C. and at 125° C., respectively, at 2.5V. The DC leakage IV characteristics 708 and 758 were measured after subjecting the device to the transmission line pulsed (TLP) conditions described above. The DC leakage IV characteristics 708 and 758, which are monitored after the TLP stress, indicate that the device has not been damaged by the TLP stress. A relatively rapid change in leakage current can be an indication that the device has reached a maximum sustainable current capability at the previously recorded TLP pulse. The maximum sustainable current in the forward bias is demonstrated to be around 1.3 A.

Figure 8:
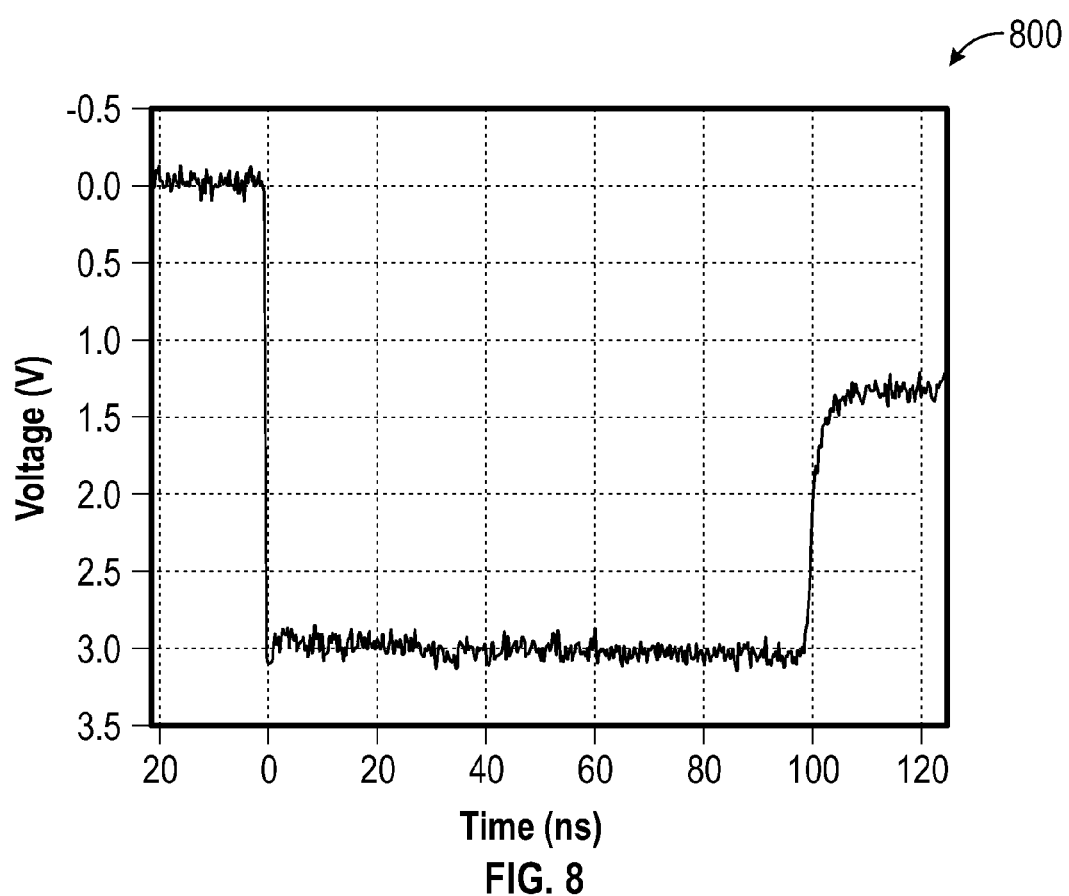
FIG. 8 is a temporal response to a voltage pulse, measured on a high speed interface protection device according to some embodiments.

FIG. 8 is a voltage-time graph 800 measured in response to a voltage pulse, measured from a high speed interface protection device similar to the device illustrated in FIG. 2, according to some embodiments. In particular, the graph 800 illustrates a transient voltage response over time at a current level of about 1 A. As illustrated, a relatively low voltage overshoot (<3.3V) and relatively fast response (<1 ns) in reaching a plateau of about 3V is demonstrated, while being subject to equivalent 1 A stress current conduction, which is equivalent to over 1,000 V human body model stress voltage level. This measurement demonstrates a fast recovery of the device, a characteristic that can be particularly desirable in advanced process technology for allowing effective voltage clamping and overstress protection for sensitive elements such as thin gate oxide at the input interface.

Figure 9:
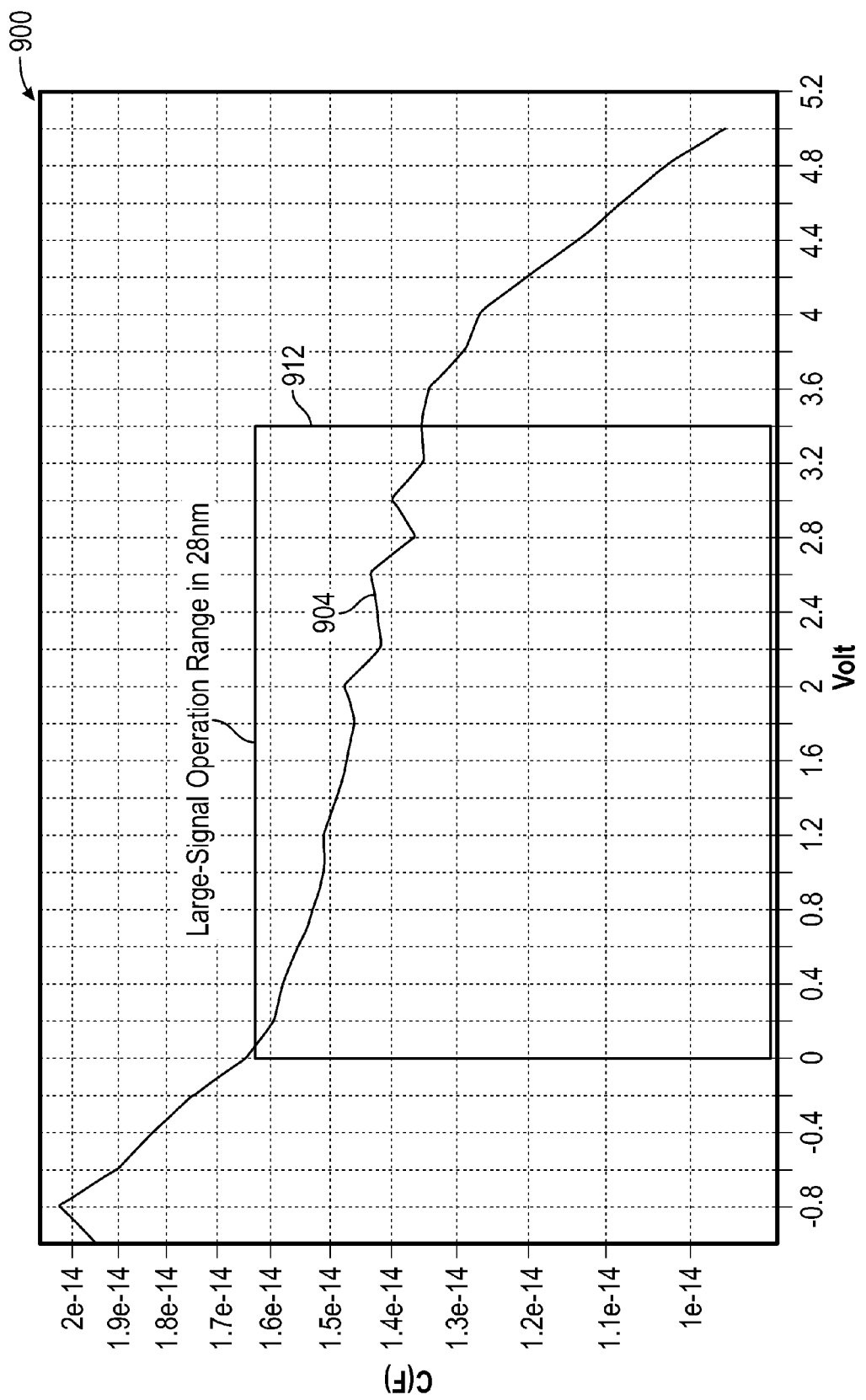
FIG. 9 is a capacitance-voltage (CV) measured on a high speed interface protection device, according to some embodiments.

FIG. 9 is a graph illustrating capacitance-voltage graph 900 measured from a high speed interface protection device similar to the device 200 illustrated in FIG. 2, according to embodiments. As illustrated, a capacitance curve 904 measured between T2 and T1 has capacitance values that remain below about 21 fF within the measured voltage range of −1.0V to about +5V. It will be appreciated that for high speed interface applications, such as high speed clock and high speed analog-to-digital converters (ADCs), the demonstrated values of capacitance are well within a desired range which can be, e.g., sub 50 fF for high data rate communication systems operating at over 10 GB/sec. In particular, the graph 900 illustrates that within about 0 and 3.4V, which can correspond to a large signal operation range for the 28 nm technology node, the measured capacitance values range between about 13 fF and about 17 fF.

Figure 10:
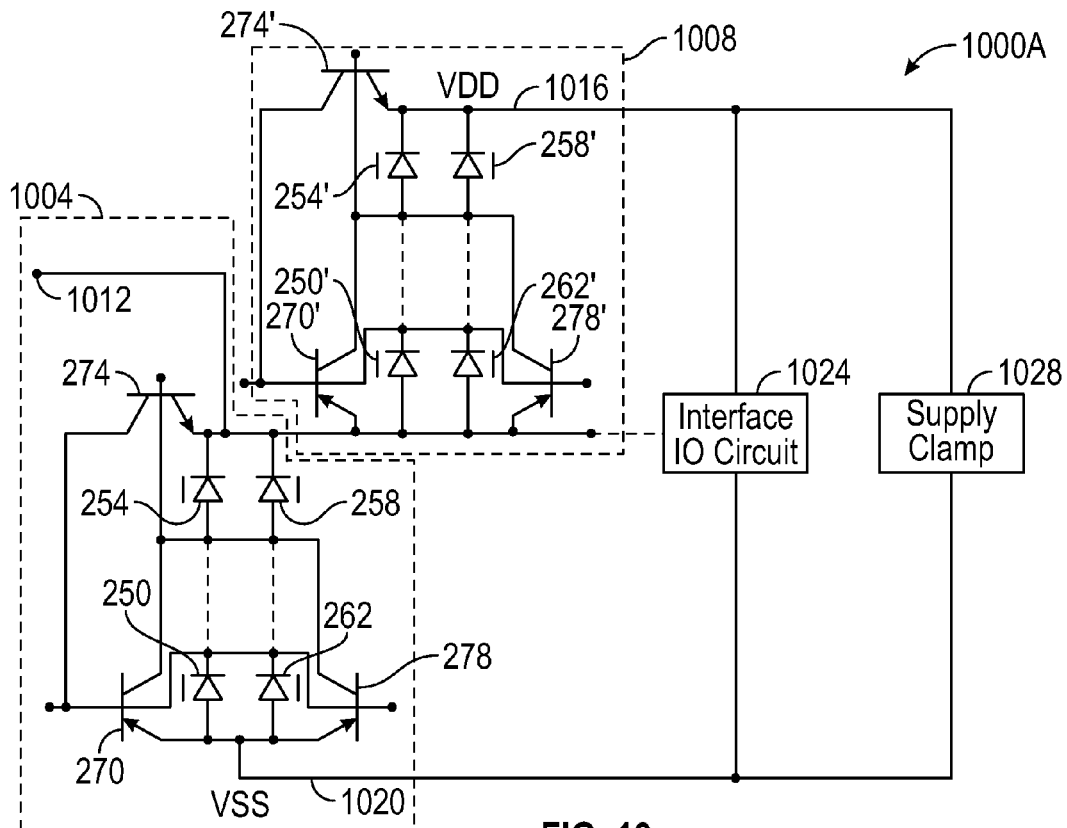
FIGS. 10 and 11 are schematic equivalent circuit diagrams representing example implementations of high speed interface protection devices, according to various embodiments.
Figure 11:
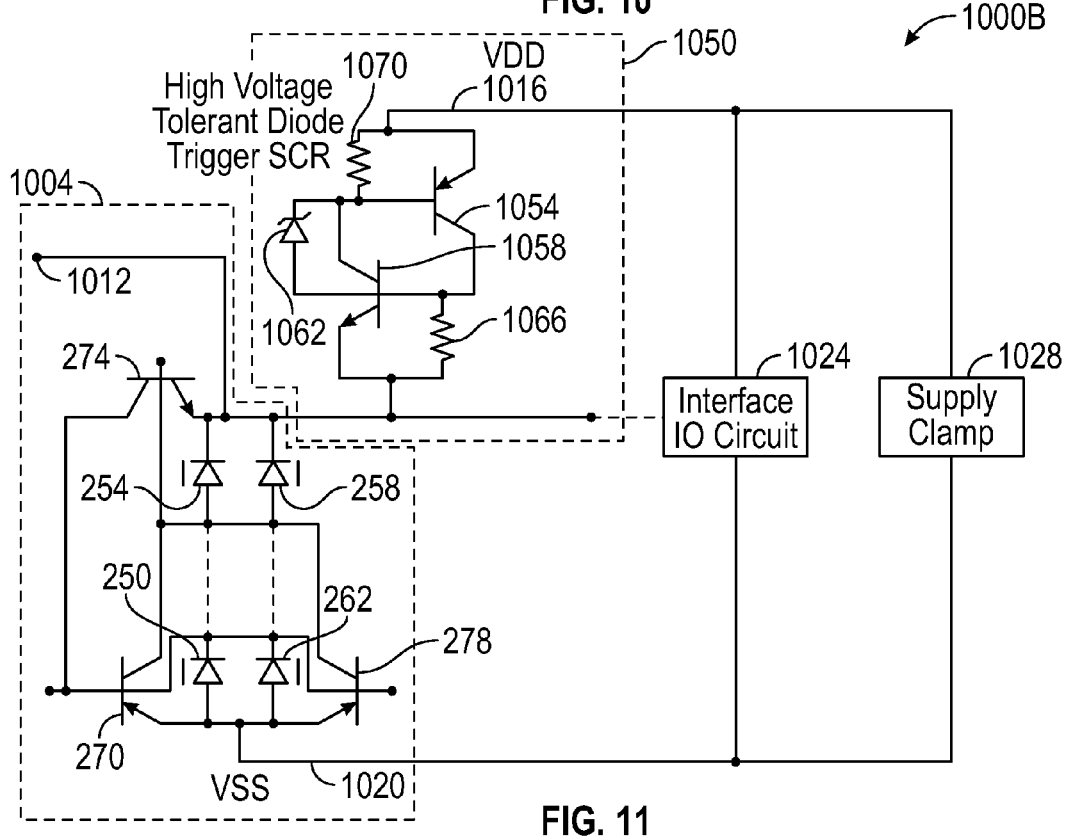

FIGS. 10 and 11 are circuit schematics illustrating protection devices 1000A and 1000B, which represent example implementations of the high speed interface protection devices described herein. The protection devices 1000A and 1000B are illustrated as two examples in which embodiments of the high speed interface protection device are implemented under common mode IO operation. An interface IO circuit 1024 and a supply clamp 1028 are connected in parallel between the high voltage side 1016 and the low voltage side 1020 in each of the protection devices 1000A and 1000B. In each of the devices 1000A and 1000B, an IO 1012 provides a common DC voltage for providing a voltage up protection between the IO 1012 and a high voltage side 1016 (which can be at, e.g., at VDD), and for providing a voltage down protection between the IO 1012 and a low voltage side 1020 (which can be at, e.g., at VSS). In each of the devices 1000A and 1000B, voltage down protection between the IO 1012 and the low voltage side 1020 is provided by a high speed interface protection device 1004, which is similar to the equivalent circuit of the device 200 described above with respect to FIG. 2, which includes serially connected diodes and a built-in SCR device. Like numerals between the high speed interface protection device 1004 and the device 200 of FIG. 2 indicate corresponding components that operate similarly under similar circumstances.

In the device 1000A of FIG. 10, voltage up protection between the high voltage side 1016 and the IO 1012 is also provided by a protection device 1008 which includes serially connected diodes and a built-in SCR device similar to that of the device 1004, in which like numerals with a prime symbol indicate corresponding components to those of the device 1004 that operate similarly under similar circumstances. Thus, in the device 1000A of FIG. 10 voltage up protection and voltage down protection are triggered under similar conditions. In contrast, in the device 1000B of FIG. 11, voltage up protection between the high voltage side 1016 and the IO 1012 is provided by a high voltage tolerant diode triggered SCR device 1050, which includes bipolar junction transistors 1054 and 1062 arranged as an SCR device, which is configured to be triggered by a diode 1062. In the device 1000B of FIG. 11, voltage up protection is triggered under different conditions from voltage down protection.

Other implementations are possible, in addition to illustrated embodiments of the devices 1000A and 1000B. For example, in some implementations, two protection devices similar to 1004 can be provided in antiparallel configuration. In other implementations related to FIG. 11, the positions of the protection devices 1004 and 1050 can be switched. In addition, other devices can be included in place of the SCR device 1050 in FIG. 11, e.g., a device represented by an equivalent circuit diagram of FIG. 18B, such that the resulting implementation is illustrated by the equivalent circuit diagram of FIG. 18C, discussed infra.

In the following, with respect to FIGS. 12-18B, alternative embodiments of high speed interface protection devices are illustrated. In these embodiments, descriptions of certain features having analogous features in FIG. 2, e.g., with the same numerical designations, are omitted.

Figure 12:
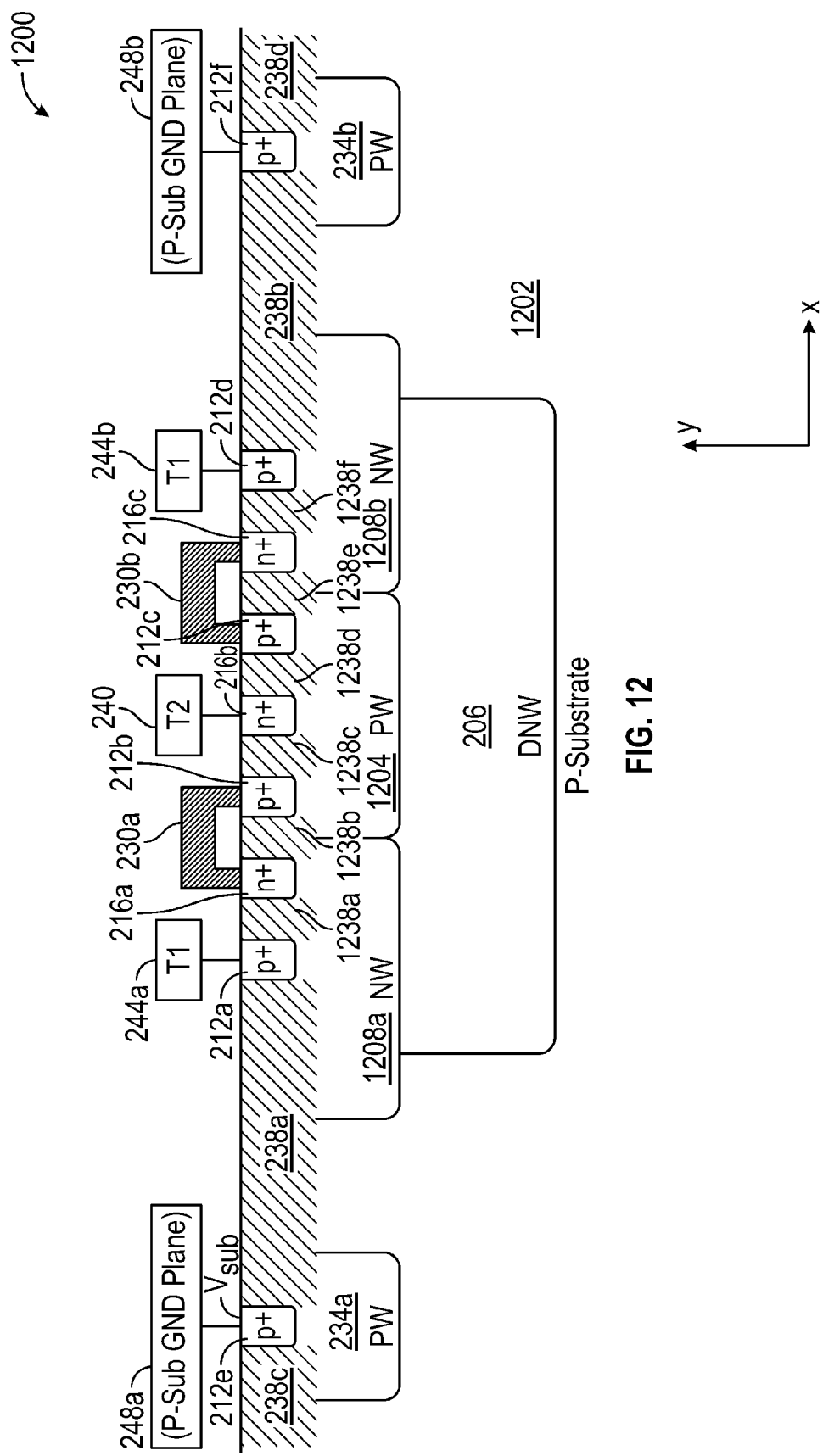

Referring to FIG. 12, a high speed interface protection device 1200 includes a semiconductor substrate 1202, e.g., a p-type semiconductor substrate, having formed therein a first P well (PW) 1204 and a first N well (NW) 1208a and a second N well (NW) 1208b adjacent each side of the first P well 1204. Similar to the device of FIG. 2, the device 1200 includes first through fourth heavily doped p-type regions (p$^+$) 212a-212d alternated with first through third heavily doped n-type (n$^+$) regions 216a-216c disposed in the P wells and N wells as described above with respect to FIG. 2. Unlike the device of FIG. 2, however, the device 1200 additionally includes first through sixth dielectric isolations 1238a, 1238b, 1238c, 1238d, 1238e and 1238f, e.g., shallow trench isolations, formed between the first p+ region 212a and the first n+ region 216a, between the first n+ region 216a and the second p+ region 212b, between the second p+ region 212b and the second n+ region 216b, between the second n+ region 216b and the third p+ region 212c, between the third p+ region 212c and the third n+ region 216c, and between the third n+ region 216c and the fourth p+ region 212d, respectively. That is, the heavily doped regions of opposite polarity are interposed by isolation. Thus, electrically floating metal layers (220a to 220f in FIG. 2) are omitted. As described above with respect to FIG. 1 supra, the isolation regions can enable n+ and p+ regions to be in relatively close proximity to provide high current density in diodes and suppress punch-throughs and band-to-band tunneling compared to diodes without the isolation regions. While all adjacent heavily doped regions are interposed by an isolation region in the illustrated embodiment, it will be appreciated that one or more of the first through sixth inter-heavily doped region isolations 1238a-1238f can be omitted and where omitted, a floating metal layer may be formed between the corresponding adjacent heavily doped regions, e.g., similar to the floating metal layers 220a to 220f described above with respect to FIG. 2. The inventors have found that the device 1200 can provide higher threshold voltages of the series-connected diodes and/or higher trigger voltages of the built-in SCR devices, as well as a lower leakage compared to the device 200 of FIG. 2, at least in part due to the presence of one or more of the isolations between adjacent heavily doped regions.

Figure 13:
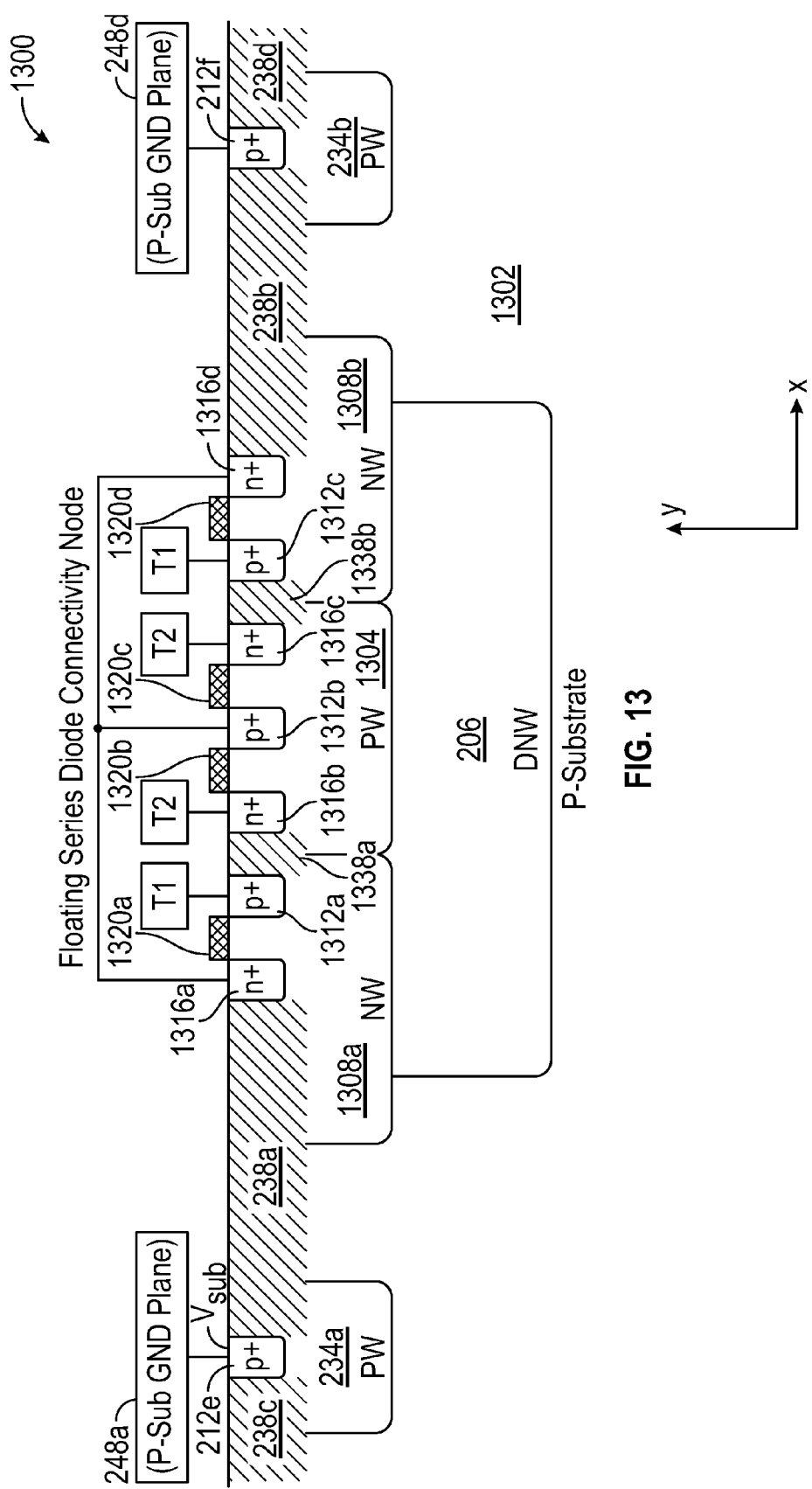

Referring to FIG. 13, a high speed interface protection device 1300 includes a semiconductor substrate 1302 having formed therein a first P well (PW) 1304, a first N well (NW) 1308a and a second N well (NW) 1308b. Relative to the device of FIG. 2, each of the heavily doped regions 212a-212d and 216a-216c in the first PW 1304 and first and second NW's 1312a and 1312b are replaced with a heavily doped region 1316a-1316d and 1312a-1312c of an opposite type. The device 1300 includes, in the first NW 1308a, a first heavily doped p-type region ($p^+$) 1312a and a first heavily doped n-type ($n^+$) region 1316a that are in swapped positions relative to the respective heavily doped regions 212a and 216a of the device 200 of FIG. 2. In the first PW 204, a second heavily doped p region ($p^+$) 1312b is interposed between a second heavily doped n ($n^+$) region 1316b and a third heavily doped n-type ($n^+$) region 1316c, whose doping types are opposite to the similarly positioned heavily doped regions of the device 200 of FIG. 2. Similarly, in the second NW 1308b, a third heavily doped p-type region ($p^+$) 1312c and a fourth heavily doped n-type ($n^+$) region 1316d are disposed, in swapped positions relative to the respective heavily doped regions of the device 200 of FIG. 2.

In the device 1300, unlike the device of FIG. 2 and similar to the device of FIG. 12, the device 1300 includes first and second dielectric isolations 1338a and 1338b, e.g., STIs, formed between the first p+ region 1312a and the second n+ region 1316b and between the third n+ region 1316c and the third p+ region 1312c, respectively. These isolations 1338a and 1338b are formed between heavily doped regions at the juncture of n- and p-wells (NW and PW). First through fourth electrically floating metal layers 1320a, 1320b, 1320c and 1320d are formed between the first n+ region 1316a and the first p+ region 1312a, between the second n+ region 1316b and the second p+ region 1312b, between the second p+ region 1312b and the third n+ region 1316c, and between the third p+ region 1312c and the fourth n+ region 1316d.

Still referring to FIG. 13, unlike the device of FIG. 2, heavily doped regions of adjacent diodes do not form a direct electrical short therebetween in the device 1300. Instead, the first n+ region 1316a, the second p+ region 1312b and the fourth n+ region 1316d are electrically shorted by a metallization structure (e.g., in M1 and M2), and in some embodiments, electrically floated. The first and third p+ regions 1312a and 1312c are each connected to a first terminal T1 and the second and third n+ regions 1316b and 1316c are each connected to a second terminal T2. The inventors have found that the device 1300, compared to the device 200 of FIG. 2, can have relatively higher reverse bias breakdown voltages of the serially connected diodes and relatively lower transient overshoot of the built-in SCR devices similar to those described above with respect to FIG. 2, at least in part because of the presence of the inter-heavily doped region isolations, and the electrical connections.

Figure 14:
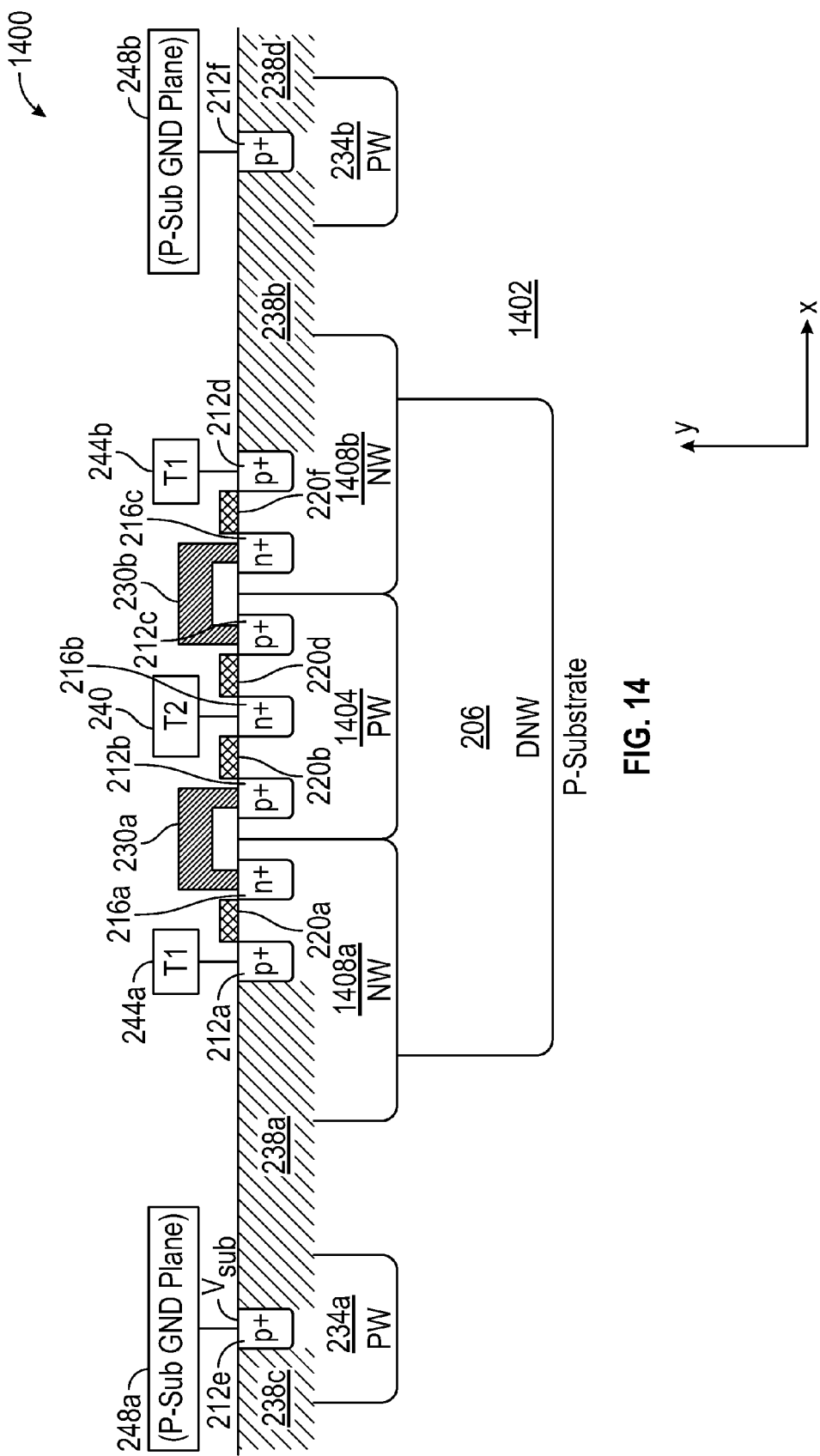

Referring to FIG. 14, a high speed interface protection device 1400 includes a semiconductor substrate 1402 having formed therein a first P well (PW) 1404, a first N well (NW) 1408a and a second N well (NW) 1408b. The device 1400 is similar to the device 200 of FIG. 2, except that the electrically floating metal layer 220c of FIG. 2 is omitted from a surface of the junction region between the first NW 1408a and the first PW 1404, and the electrically floating metal layer 220e of FIG. 2 is omitted from a surface of the junction region between the first PW 1404 and the second NW 1408b. The inventors have found that while the device 1400 does not have the electrically floating metal layers 220c and 220e of FIG. 2 and does not have the dielectric isolations 1238b and 1238e of FIG. 12, the doping concentration of the NW 1408a, PW 1404 and NW 1408, when kept sufficiently low, can provide a level of isolation that can be acceptable, especially when the impedances of the metallization structures 230a and the 230b are sufficient low.

Figure 15:
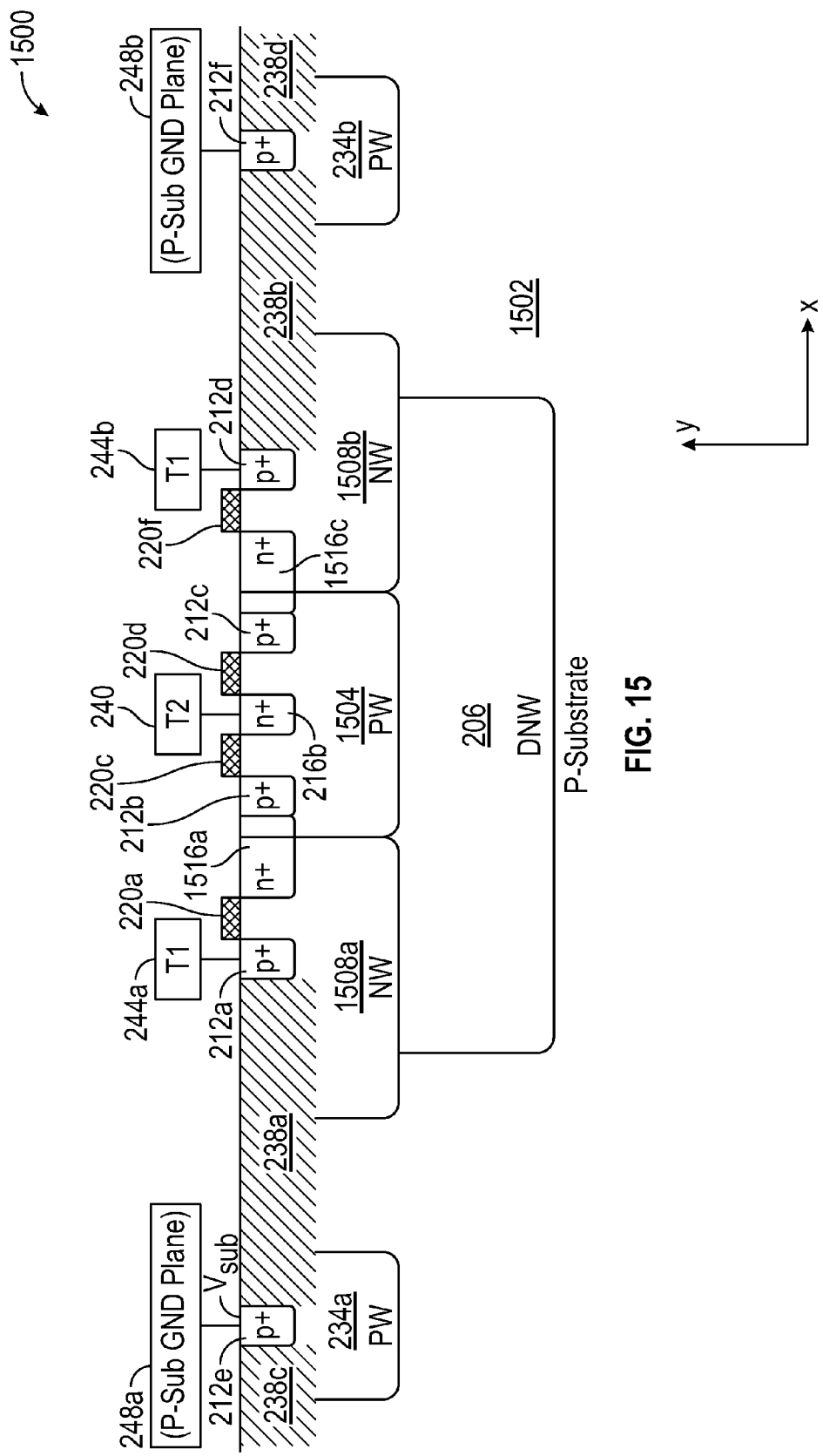

Referring to FIG. 15, a high speed interface protection device 1500 includes a semiconductor substrate 1502, having formed therein a first P well (PW) 1504, a first N well (NW) 1508a and a second N well (NW) 1508b. The device 1500 is similar to the device 200 of FIG. 2, except that a first heavily doped n-type ($n^+$) region 1516a formed in the first NW 1508a extends laterally into the first PW 1504, thereby traversing the junction formed between the first NW 1508a and the first PW 1504. Similarly, a third heavily doped n-type ($n^+$) region 1516c formed in the second NW 1508b extends laterally into the first PW 1504, thereby traversing the junction formed between the second NW 1508b and the first PW 1504. In some embodiments, one or both of the first and third n+ regions 1516a and 1516c are in direct contact with the second and third p+ regions 212b and 212c, respectively, thereby creating electrical shorts therebetween. It will be appreciated that, while the first n+ region 1516a and the second p+ region 212b are semiconductor regions, because both regions are heavily doped and in contact, there will be essentially no PN junction effect and the resulting structure serves to form an electrical short therebetween. Similarly, the third n_ region 1516c and the third p+ region 212c serve to form an electrical short therebetween. Correspondingly, electrically floating metal layers are omitted from a surface where the $p^+$ and $n^+$ regions make laterally contact, isolations are likewise omitted, and metallization shorting structures of the previously described embodiments are also omitted. The inventors have found that the device 1500, at least in part due to the contacting n+ and p+ regions, compared to the device 200 of FIG. 2, can advantageously provide lower threshold voltages of the serially connected diodes and/or lower trigger voltages of the built-in SCR devices, as well as lower transient overshoot and lower leakage current.

Figure 16:
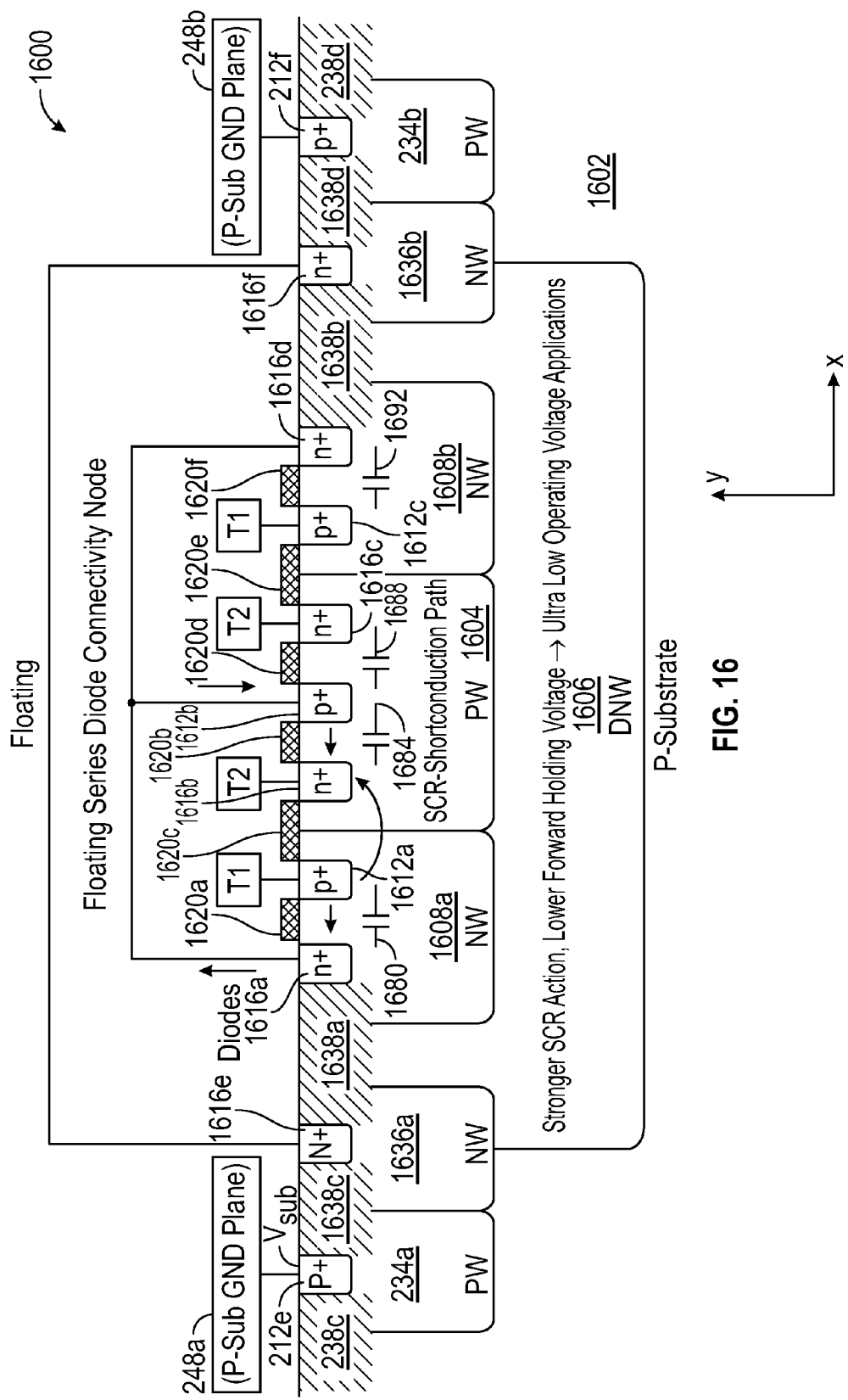

Referring to FIG. 16, a high speed interface protection device 1600 includes a semiconductor substrate 1602 having formed therein a first P well (PW) 1604, a first N well (NW) 1608a and a second N well (NW) 1608b. Unlike the device of FIG. 2, the deep N well 1606 forms a tub laterally surrounding the first NW 1608a, the PW 1604 and the second NW 1608b and contacting outer sides of the first and second NWs 1608a and 1608b. The doping types of first through fourth heavily doped n ($n^+$) regions 1616a-1616d and of the first through third heavily doped p (p+) regions 1612a-1612c, are reversed relative to heavily doped regions in the same positions in FIG. 2, and similar to the device 1300 described above with respect to FIG. 13. First through sixth electrically floating metal layers 1620a-1620f are formed between the first n+ region 1616a and the first p+ region 1612a, between the second n+ region 1616b and the second p+ region 1612b, between the first p+ region 1612a and the second n+ region 1616b, between the second p+ region 1612b and the third n+ region 1616c, between the third n+ region 1616*c* and the third p+ region 1612*c* and between the third p+ region 1612*c* and the fourth n+ region 1616*d*, respectively.

Still referring to FIG. 16, the device 1600 additionally includes a third N well (NW) 1636*a* having formed therein a fifth heavily doped n-type (n⁺) region 1616*e* and interposed between a second P well (PW) 234*a* and the first NW 1608*a*. In some embodiments, the third N well (NW) 1636*a* contacts the second P well (PW) 234*a* and forms a junction therebetween. The device 1600 additionally includes a fourth N well (NW) 1636*b* having formed therein a sixth heavily doped n-type (n⁺) region 1616*f* and interposed between a third P well (PW) 234*b* and the second NW 1608*b*. In some embodiments, the fourth N well (NW) 1636*b* contacts the third P well (PW) 234*b* and forms a junction therebetween. First through fourth isolations 1638*a*, 1638*b*, 1638*c* and 1638*d* are formed between the first and fifth n+ regions 1616*a* and 1616*e*, between the fourth and sixth n+ regions 1616*d* and 1616*f*, between a fifth heavily doped p-type (p+) region 212*e* and the fifth n+ region 1616*e*, and between a fifth heavily doped p-type (p+) region 212*f* and the sixth n+ region 1616*f*, respectively.

Unlike the deep N well (DNW) 206 of the device of FIG. 13, which does not laterally extend past the first and second NW 1308*a* and 1308*b*, the deep N well (DNW) 1606 of the device of FIG. 16 contacts bottom boundaries of each of the first PW 1604 and first and second NWs 1608*a* and 1608*b*, and laterally extends past the first and second NWs 1608*a* and 1608*b*. In the illustrated embodiment, the deep N well (DNW) 1606 surrounds the first and second NWs 1608*a*, 1608*b* by contacting the outer vertical lateral boundaries of the first and second NWs 1608*a* and 1608*b*. The DNW 1606 further extends to at least partially contact bottom boundaries of the third and fourth NW 1636*a* and 1636*b*.

Still referring to FIG. 16, similar to the device of FIG. 13, the first n+ region 1616*a*, the second p+ region 1612*b* and the fourth n+ region 1616*d* are electrically shorted, and in some embodiments, electrically floated. Also similar to the device of FIG. 13, the first and third p+ regions 1612*a* and 1612*c* are each connected to a first terminal T1 and the second and third n+ regions 1616*b* and 1616*c* are each connected to a second terminal T2. Additionally, the fifth and sixth n+ regions 1616*e* and 1616*f* are electrically shorted, e.g., forming a ring, and in some embodiments, electrically floated. The inventors have found that the device 1600, compared to the device 200 of FIG. 2, can advantageously provide embedded PNPN SCRs having lower on-state resistance and faster trigger speeds for lower voltage clamping capability during transient stress conditions. Such device response can be desirable for devices having interface pins with low input resistance and for protecting sensitive circuit elements, such as input gates, in such devices.

According to various embodiments, operational parameters including the threshold voltages of the serially connected diodes and the trigger voltages of the bidirectional transistors described above, e.g., the device of FIG. 2 and FIG. 3A/3B, can be further engineered by including, among other things, additional diodes in series. Referring back to FIG. 2, e.g., the device 200 includes the first serially connected diodes which included two diodes in series, namely first and second diodes 250, 254 (350, 354 in FIG. 3A, represented as first and second capacitor 380, 384 in FIG. 3B), and the second serially connected diodes which included two diodes in series, namely third and fourth diodes 258, 262 (358, 362 in FIG. 3A, represented as third and fourth capacitors 388, 392 in FIG. 3B). Additional diodes can be included as part of the serially connected diodes, as described below with respect to FIGS. 17 and 18.

Figure 17:
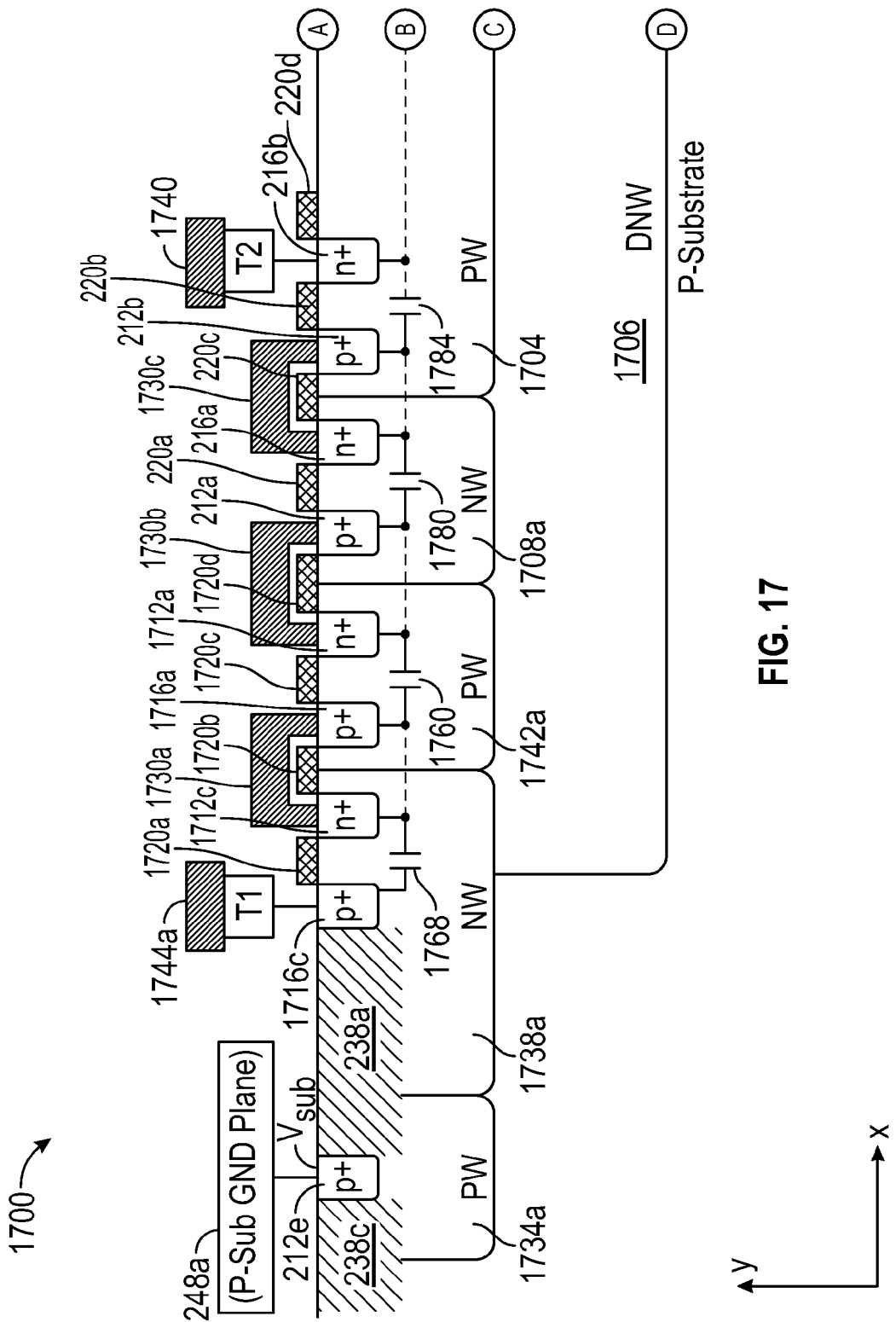
Figure 17:
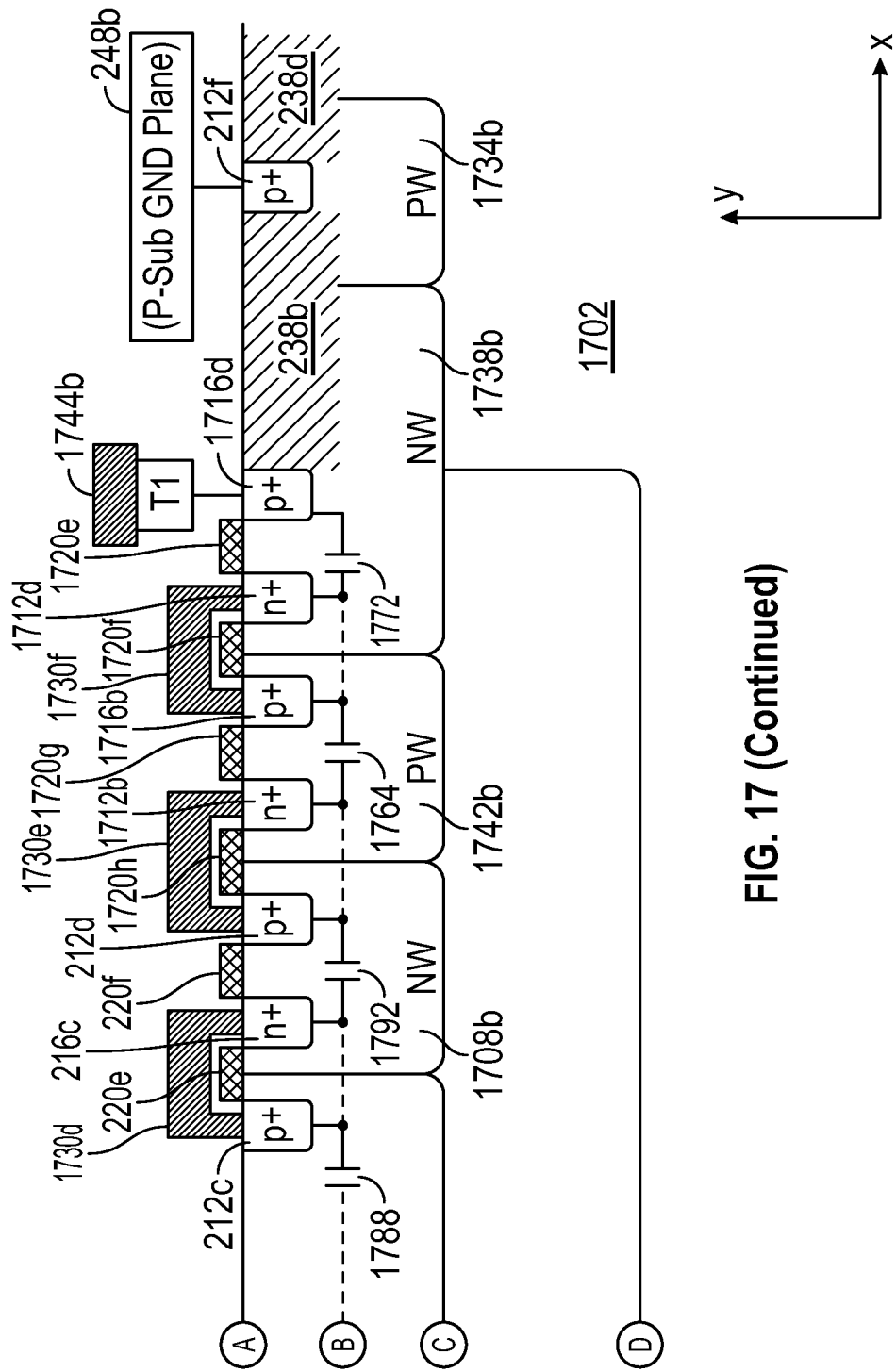

Referring to FIG. 17, a high speed interface protection device 1700 includes a semiconductor substrate 1702 having formed therein a first P well (PW) 1704, a first N well (NW) 1708*a* and a second N well (NW) 1708*b*. Similar to the device of FIG. 2, the device 1700 includes first through fourth heavily doped p-type regions (p⁺) 212*a*-212*d* and first through third heavily doped n-type (n⁺) regions 216*a*-216*c* disposed in the P well 1704 N wells 1708*a*, 1708*b*, as described above with respect to FIG. 2.

Thus configured, similar to the device of FIG. 2, on the left side of FIG. 17, the device 1700 includes first serially connected diodes, which includes first and second diodes (represented as capacitors) 1780 and 1784 in which the second n+ region 216*b* connected to a second terminal (T2) 1740 serves as a cathode, and are connected in series by a first metallization structure 1730*c*. Similarly, on the right side of FIG. 17, the device 1700 includes second serially connected diodes, which includes third and fourth diodes (represented as capacitors) 1788 and 1792 that are similarly formed and connected.

Unlike the protection device 200 of FIG. 2, each side of the device 1700 includes two additional diodes serially connected to the first and second serially connected diodes. That is, fifth and seventh diodes/capacitors 1760 and 1768 on the left side and sixth and eighth diodes/capacitors 1764 and 1772 on the right side that are further serially connected to the first and second serially connected diodes, respectively. The additional diodes are formed in a second PW 1742*a* and a third PW 1742*b* formed at outer sides of the first NW 1708*a* and the second NW 1708*b*, respectively, and a third NW 1738*a* and a fourth NW 1738*b* formed at outer sides of the second PW 1742*a* and the third PW 1742*b*, respectively. The additional diodes further include a seventh p+ region 1716*a* and a fourth n+ region 1712*a* each formed in the second PW 1742*a*, an eighth p+ region 1716*b* and a fifth n+ region 1712*b* each formed in the third PW 1742*b*, a ninth p+ region 1716*c* and a sixth n+ region 1712*c* each formed in the third NW 1738*a*, and a tenth p+ region 1716*d* and a seventh n+ region 1712*d* each formed in the fourth NW 1738*b*.

Unlike the protection device 200 of FIG. 2, each of the ninth and tenth p+ regions 1716*c* and 1716*d* serves as an overall anode of the first and second serially connected diodes and is connected to first terminals (T1) 1744*a* and 1744*b*, respectively. Thus, on the left side, the first serially connected diodes/capacitors includes the seventh diode/capacitor 1768, the fifth diode/capacitor 1760, the first diode/capacitor 1780 and the second diode/capacitor 1784, where the adjacent capacitors are electrically connected in series by first, second and third metallization structures 1730*a*, 1730*b* and 1730*c*, where the ninth p+ region 1716*c* serves as the overall anode connected to T1 1744*a* and the second n+ region 216*b* serves as the overall cathode connected to T2 1740. Similarly, on the right side, the second serially connected diodes/capacitors includes the eighth diode/capacitor 1772, the sixth diode/capacitor 1764, the third diode/capacitor 1788 and the fourth diode/capacitor 1792, where the adjacent capacitors are electrically connected in series by fourth, fifth and sixth metallization structures 1730*d*, 1730*e* and 1730*f*, where the tenth p+ region 1716*d* serves as the overall anode connected to T1 1744*b* and the second n+ region 216*b* serves as the overall cathode connected to T2 1740.

In addition, similar to the device 200 of FIG. 2, between adjacent heavily doped regions of the serially connected diodes, an electrically floating metal layer is formed, which includes first to sixth electrically floating metal layers 220*a* to 220*f*, seventh to tenth electrically floating metal layers 1720*a* to 1720*d* and eleventh to fourteenth electrically floating metal layers 1720*e* to 1720*h*.

Figure 18A:
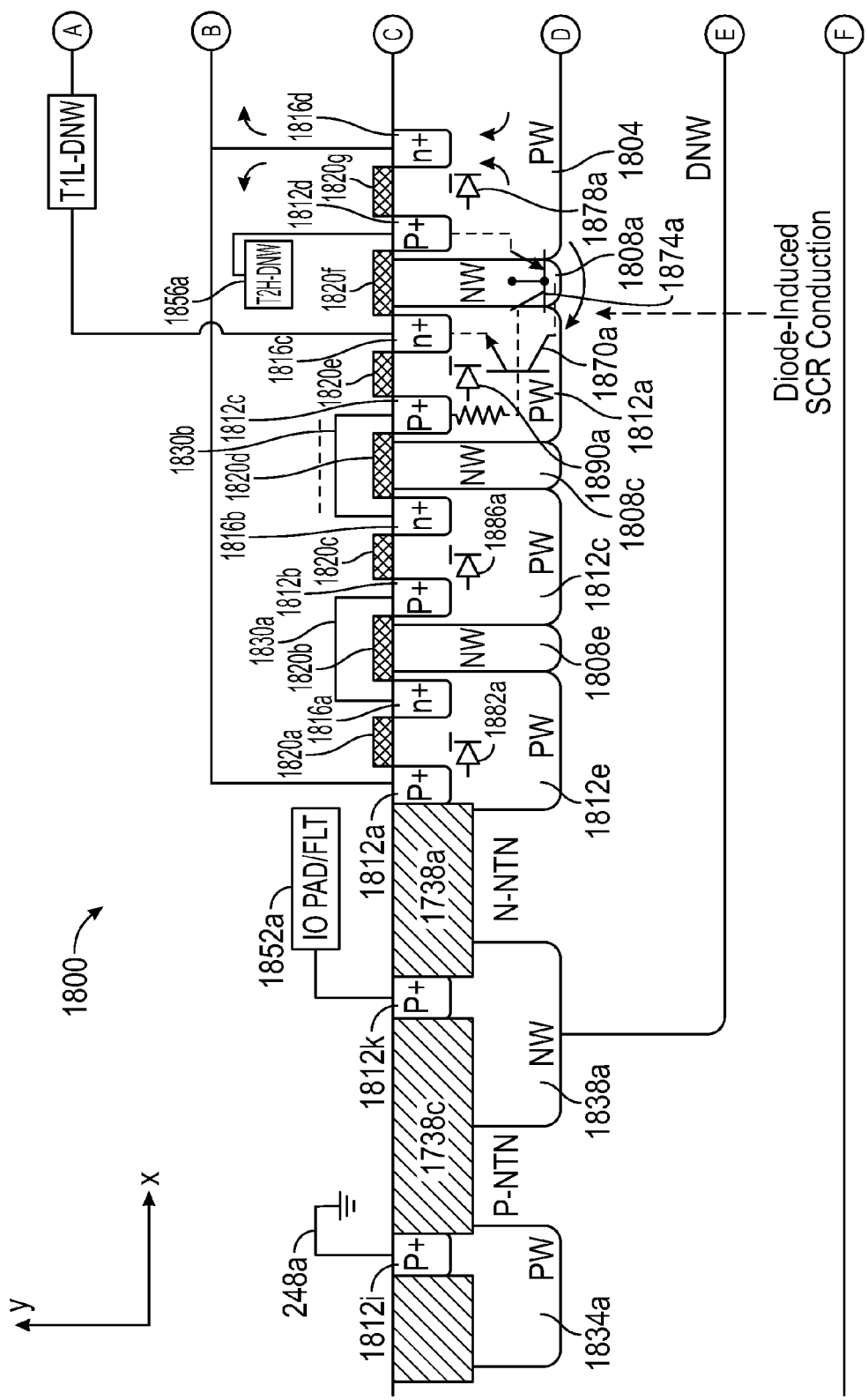
Figure 18A:
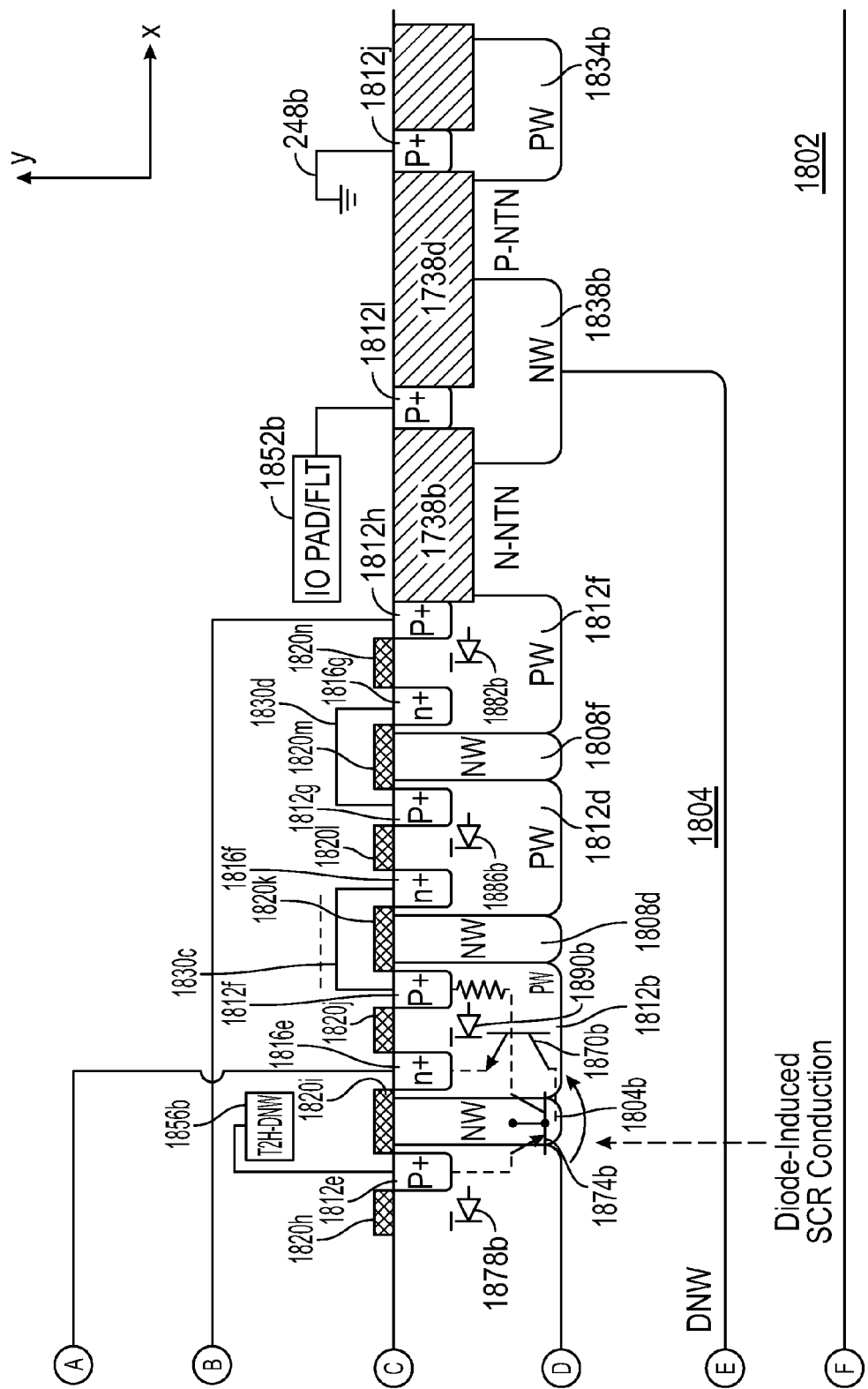

Referring to FIG. 18A, a high speed interface protection device 1800 includes a semiconductor substrate 1802 having formed therein a first P well (PW) 1804, a first N well (NW) 1808*a* and a second N well (NW) 1808*b*. Unlike the device of FIG. 2, the first and second NWs 1808*a* and 1808*b* do not have heavily doped regions formed therein. The device 1800 additionally includes second and third PWs 1812*a* and 1812*b* formed on outer sides of the first and second NWs 1808*a* and 1808*b*, respectively; third and fourth NWs 1808*c* and 1808*d* formed on outer sides of second and third PWs 1812*a* and 1812*b*, respectively; fourth and fifth PWs 1812*c* and 1812*d* formed on outer sides of the third and fourth NWs 1808*c* and 1808*d*, respectively, fifth and sixth NWs 1808*e* and 1808*f* formed on outer sides of the fourth and fifth PWs 1812*c* and 1812*d*, respectively, sixth and seventh PWs 1812*e* and 1812*f* formed on outer sides of the fifth and sixth NWs 1808*e* and 1808*f*, respectively. Thus, the device 1800 includes a plurality of P wells alternating with the N wells in the x-direction. Each of the first through sixth NWs 1808*a*-1808*e* is substantially narrower in width, e.g., less than 50%, compared to the width of the PW formed on the outer side of the each of the NWs, and has formed on the surface electrically floating layers 1820*f*, 1820*i*, 1820*d*, 1820*k*, 1820*b* and 1820*m*, respectively.

Similar to the device of FIG. 2, the first PW 1804 has formed therein two p+ regions 1812*d* and 1812*e* each spaced from an intervening n+ region 1816*d*, and electrically floating metal layers 1820*g* and 1820*h* on the surface of PW 1804 between the p+ region 1812*d* and the n+ region 1816*d*, and between the n+ region 1816*d* and the p+ region 1812*e*. Each of the second through seventh PWs 1812*a*-1812*f* have formed therein a p+ region separated by an n+ region and has an electrically floating layer formed on the surface of the intervening region. As illustrated, electrical floating layers 1820*a*, 1820*c*, 1820*e*, 1820*j*, 1820*l* and 1820*n* are formed between the respective p+ region and the n+ region of the second through seventh PWs 1812*a*-1812*f*. On the left half of the device 1800, the n+ region 1816*a* and the p+ region 1812*b* are electrically shorted by a first metallization structure 1830*a*, and the n+ region 1816*c* and the p+ region 1812*c* are electrically shorted by a second metallization structure 1830*b*, to provide the serial connection between diodes, in similar manner to that described with respect to FIG. 2. Similarly, on the right half of the device 1800, the p+ region 1812*f* and the n+ region 1816*f* are electrically shorted by a third metallization structure 1830*c*, and the p+ region 1812*g* and the n+ region 1816*g* are electrically shorted by a fourth metallization structure 1830*d*, to provide the serial connection between diodes, in similar manner to that described with respect to FIG. 2.

The device 1800 additionally includes seventh and eighth NWs 1838*a* and 1838*b* on outer sides of sixth and seventh PWs 1812*e* and 1812*f*, respectively, and separated by a native n-type region N-NTN and an isolations 1738*a* and 1738*b*. The DNW 1804 laterally extends to contact and overlap each of first to sixth NWs 1808*a*-1808*e* and first to seventh PWs 1804 and 1812*a*-1812*f*, and at least partially contact and overlap each of the seventh and the eighth NWs 1838*a* and 1838*b*. As described herein, a native region refers to a region formed by a trailing edge of an implant doping profile, in which the dopant concentrations are lower than about $1\times10^{16}$/cm$^3$, lower than about $1\times10^{15}$/cm$^3$, lower than about $1\times10^{14}$/cm$^3$, between about $1\times10^{15}$/cm$^3$ and about $1\times10^{12}$/cm$^3$. Thus, while N-NTN is a part of the DNW 1804, the N-NTN regions laterally between the smaller NW and PW regions will have substantially lower dopant concentration (the native DNW region concentration) relative to the region of the DNW 1804 below the smaller NW and PW regions.

The device 1800 additionally includes eighth and ninth PWs 1834*a* and 1834*b* outside of the seventh and the eighth NWs 1838*a* and 1838*b*, respectively, and separated by a native p-type region P-NTN (background substrate doping level) and an isolations 1738*c* and 1738*d*.

Each of the seventh and eighth NWs 1838*a* and 1838*b* and eighth and ninth PWs 1834*a* and 1834*b* has formed therein a heavily doped p+ region 1812*k*, 1812*l*, 1812*i* and 1812*j*, respectively.

Referring to electrical connections above the substrate surface in FIG. 18A, the p+ regions 1812*i* and 1812*j* are connected to grounds 248*a* and 248*b*, respectively; p+ regions 1812*k* and 1812*l* are connected to IO 1852*a* and IO 1852*b*, respectively; the n+ region 1816*c* and the n+ region 1816*e* are commonly connected to a first terminal (T1L-DNW); and the p+ region 1812*d* and the p+ region 1812*e* are connected to second terminals (T2H-DNW) 1856*a* and 1856*b*, respectively. Additionally, the p+ region 1812*a*, the p+ region 1812*h* and the n+ region 1816*d* are electrically shorted.

In operation, the device 1800 provides a serially connected diode having additional diodes compared to the device of FIG. 2, to provide a higher threshold voltage. The equivalent circuit diagram 1800B of FIG. 18B, which represents only one half of the device 1800, illustrates that the bases and emitters of an NPN transistor 1870 and a PNP transistor 1874 are connected to each other such that a built-in NPNPN SCR device is formed between the first terminal T1L-DNW (directly connected to the emitter of the NPN transistor 1870), and the second terminal T2H-DNW (directly connected to the emitter of the PNP transistor 1874), in a similar manner as described above with respect to FIG. 2. The equivalent circuit diagram also illustrates that between the first terminal T1L-DNW (connected to the emitter of the PNP transistor 1874) and the second terminal T2H-DNW (connected to the emitter of the NPN transistor 1870), first to fourth diodes 1878, 1882, 1886 and 1890 are formed. The base of the NPN transistor 1870 and the collector of the PNP transistor 1874 are each connected to a node between the third diode 1886 and the fourth diode 1890. The base of the PNP transistor 1874 and the collector of the NPN transistor 1870 are each connected to VDD power supply or the second terminal T2H-DW, through a resistor 1898 and a fifth diode 1894. While FIG. 18B only illustrates the left half of the device 1800, the right half of the device 1800 also can be represented by a similar equivalent circuit. Thus, the diodes 1878, 1882, 1886 and 1890 of the equivalent circuit 1800B of FIG. 18B correspond to diodes 1878*a*, 1882*a*, 1886*a* and 1890*a* on the left side of the device 1800 of FIG. 18A, while corresponding to diodes 1878*b*, 1882*b*, 1886*b* and 1890*b* on the left side of the device 1800 of FIG. 18A. Similarly, the NPN transistor 1870 of the equivalent circuit 1800B of FIG. 18B corresponds to NPN transistors 1870*a* and 1870*b* on the left and right sides of the device 1800 of FIG. 18A, respectively. Similarly, the PNP transistor 1874 of the equivalent circuit 1800B of FIG. 18B corresponds to PNP transistors 1874*a* and 1874*b* on the left and right sides of the device 1800 of FIG. 18A, respectively.

Figure 18B:
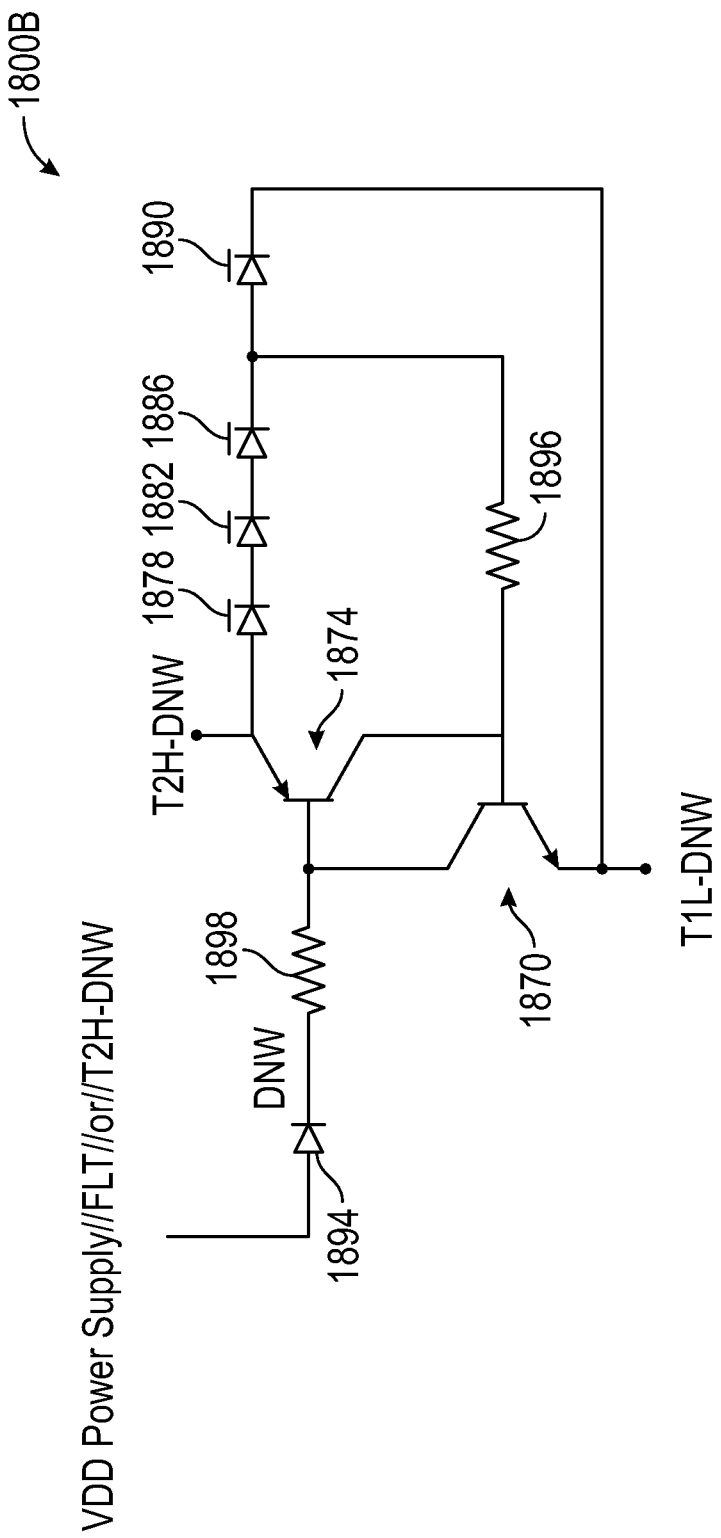
FIG. 18B is an equivalent circuit diagram of a portion of the high speed interface protection device of FIG. 18A, according to some embodiments.
Figure 18C:
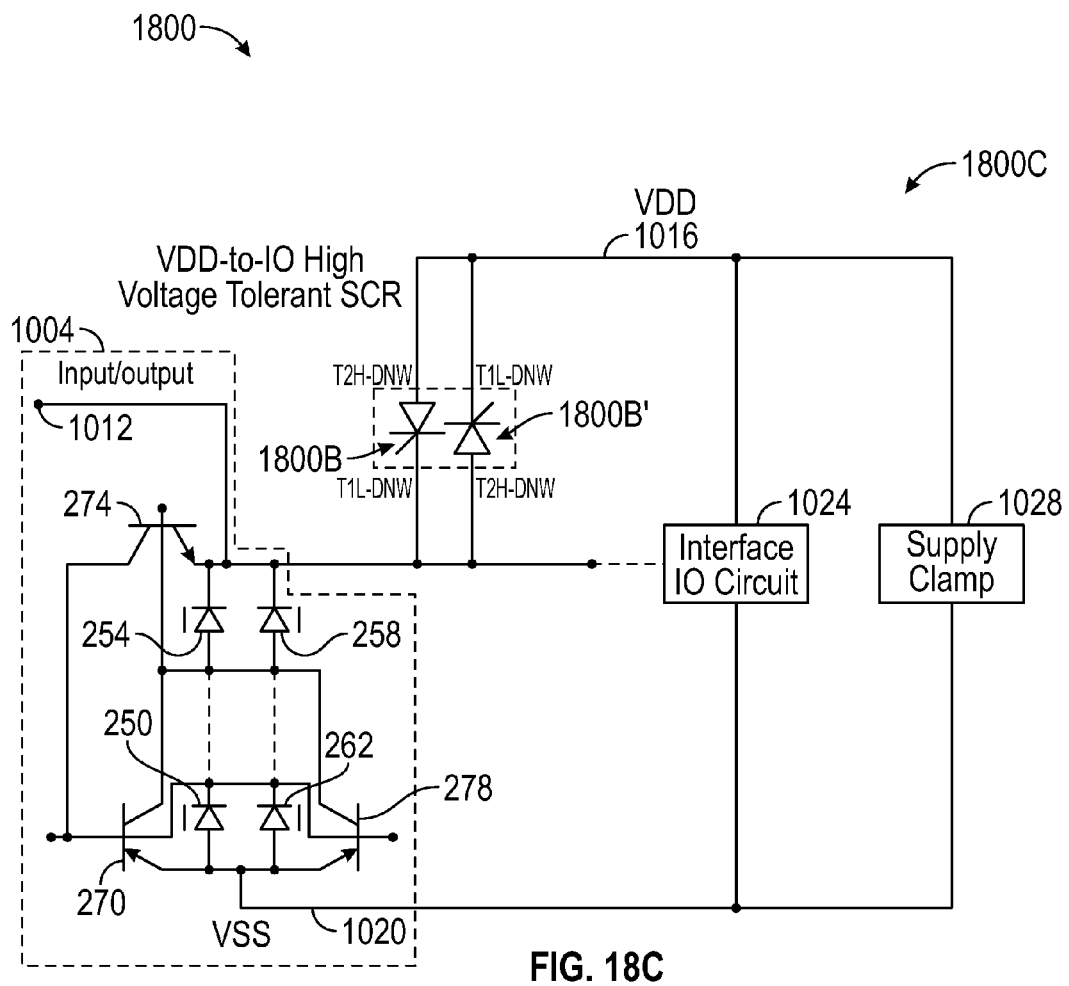
FIG. 18C is an equivalent circuit diagram representing an example implementation of the high speed interface protection device of FIGS. 18A and 18B, according to some embodiments.

Referring to FIG. 18C, as described above with respect to FIG. 11, the device represented by the equivalent circuit of FIG. 18B can be connected with a high speed interface protection device represented by the equivalent circuit 1004 in FIG. 11, in place of the SCR device 1050 in FIG. 11. The equivalent circuit 1800C of FIG. 18C is similar to FIG. 11, except that the device 1800B of FIG. 1800B is connected between the high voltage side 1016 and the IO 1012. In addition, a device 1800B', which is antiparallel to the device 1800B, is additionally connected between the high voltage side 1016 and the IO 1012, to provide bipolar protection.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words above using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An integrated circuit device, comprising:
a semiconductor substrate having formed therein at least two wells and a deep well underlying and contacting the at least two wells;
a first PN diode formed in one of the at least two wells and comprising a first heavily doped region of a first conductivity type and a first heavily doped region of a second conductivity type;
a second PN diode formed in another one of the at least two wells and comprising a second heavily doped region of the first conductivity type and a second heavily doped region of the second conductivity type, wherein the first PN diode and the second PN diode are electrically shorted by an electrical shorting structure to form a first plurality of serially connected diodes having a threshold voltage; and
a PNPN silicon-controlled rectifier (SCR) having a trigger voltage and comprising the first heavily doped region of the first conductivity type, the at least two wells, the deep well, and the second heavily doped region of the second conductivity type.

2. The integrated circuit device of claim 1 wherein doping concentrations of the wells, distances between adjacent ones of the heavily doped regions, and an electrical resistance of the electrical shorting structures are such that the threshold voltage is lower than the trigger voltage.

3. The integrated circuit device of claim 1, wherein:
the semiconductor substrate is a p-type semiconductor substrate, and wherein the at least two wells include an N well and a P well laterally adjacent to the N well, and the deep well is a deep N well,
the first heavily doped region of the first conductivity type is a first $p^+$ region and the first heavily doped region of the second conductivity type is a first $n^+$ region, the first $p^+$ region and the first $n^+$ region each formed in the N well,
the second heavily doped region of the first conductivity type is a second $p^+$ region and the second heavily doped region of the second conductivity type is a second $n^+$ region, the second $p^+$ region and the second $n^+$ region each formed in the P well, and
wherein the electrical shorted structure comprises a metallization structure contacting the first$^+$ region and the second $p^+$ region.

4. The integrated circuit device of claim 3, further comprising:
a second N well formed laterally adjacent the P well such that the P well is interposed between the N well and the second N well, the deep N well laterally extending further to contact the second N well;
a third PN diode comprising a third $p^+$ region and the second $n^+$ region each formed in the P well;
a fourth PN diode comprising a fourth $p^+$ region and a third $n^+$ region each formed in the second N well;
a second metallization structure contacting the third $n^+$ region and the third $p^+$ region to form an electrical short therebetween such that the third PN diode and the fourth PN diode form a second plurality of serially connected diodes having a second threshold voltage; and
a second PNPN silicon-controlled rectifier (SCR) having a second trigger voltage comprising the fourth p+ region, the second N well, the deep N well, the P well and the second $n^+$ region,
wherein the doping concentrations of the wells, distances between adjacent ones of the heavily doped regions and the metallization structures are such that the second threshold voltage is lower than the second trigger voltage.

5. The integrated circuit device of claim 4, wherein the first $n^+$ region, the second $p^+$ region, the N well and the P well have doping concentrations such when the first n+ region is at a higher voltage than the second p+ region, an electrical path from the first n+ region to the second p+ region through the N well region and the P well region has a substantially higher electrical resistance than the electrical resistance of the metallization structure shorting the first n+ region and the second p+ region.

6. The integrated circuit device of claim 5, wherein the first to third n+ regions and the first to fourth p+ regions are each doped to have active dopant concentrations between about $1\times10^{20}$ cm$^{-3}$ and about $8\times10^{20}$ cm$^{-3}$, and wherein the N well, the P well, the second N well and the deep N well are each doped to have active dopant concentrations between about $1.5\times10^{16}$ cm$^{-3}$ and about $7.5\times10^{16}$ cm$^{-3}$, and wherein a total resistance of each of the metallization structure is between about 100 Ohms and about 1000 Ohms.

7. The integrated circuit device of claim 4, wherein each of the first p+ region and the fourth p+ region is connected to a first terminal serving as a common anode and the second n+ region is connected to a second terminal serving as a common cathode, the common anode and the common cathode being common for the first and second serially connected diodes and the first and second PNPN SCRs.

8. The integrated circuit device of claim 7, wherein:
the first PN diode further comprises a first electrically floating metal layer formed over a surface of the N well between the first p+ region and the first n+ region;
the second PN diode further comprises a second electrically floating metal layer formed over a surface of the P well between the second p+ region and the second n+ region;
the third PN diode further comprises a third electrically floating metal layer formed over the surface of the P well between the third p+ region and the second n+ region; and
the fourth PN diode further comprises a fourth electrically floating metal layer formed over a surface of the second N well between the fourth p+ region and the third n+ region.

9. The integrated circuit device of claim 8, wherein each of the first through fourth electrically floating metal layers are separated from the underlying surface of the respective well by an intervening insulating oxide.

10. The integrated circuit device of claim 8, further comprising a fifth electrically floating metal layer formed between the first n+ region and the second p+ region and crossing a junction formed between the N well and the P well, and a sixth electrically floating metal layer formed between the third p+ region and the third n+ region and crossing a junction formed between the P well and the second N well.

11. The integrated circuit device of claim 7, wherein:
the first PN diode further comprises a first dielectric isolation formed in the NW between the first p+ region and the first n+ region;
the second PN diode further comprises a second dielectric isolation formed in the PW between the second p+ region and the second n+ region;
the third PN diode further comprises a third dielectric isolation formed in the PW between the third p+ region and the second n+ region; and
the fourth PN diode further comprises a fourth dielectric isolation formed in the second NW between the fourth p+ region and the third n+ region.

12. The integrated circuit device of claim 4, further comprising:

a second P well at an outer side of the N well opposite a side facing the P well;
a third N well at an outer side of the second P well opposite a side facing the P well;
a third P well at an outer side of the second N well opposite a side facing the P well; and
a fourth N well at an outer side of the third P well opposite a side facing the P well,
wherein each of the second P well, the third N well, the third P well and the fourth N well has formed therein an additional diode comprising a p+ region, an n+ region, and an electrically floating metal layer formed over a surface of the respective well between the p+ region and the n+ region,
wherein the first plurality of serially connected diodes includes diodes of the second P well and the third N well, and the second plurality of serially connected diodes includes diodes of the third P well and the fourth N well, and
wherein each of the p+ regions of the third N well and the fourth N well are connected to a first terminal serving as a common anode for first and second pluralities of serially connected diodes, and the second n+ region is connected to a second terminal serving as a common cathode for the first and second pluralities of serially connected diodes.

13. The integrated circuit device of claim 5, wherein each of the first and second metallization structures are formed in a metallization level closest to the substrate.

14. The integrated circuit device of claim 5, wherein the first terminal comprises first conductive fingers each formed in a lower metallization level and over one of the N well and the second N well, and the second terminal comprises a second conductive finger formed in the lower metallization level and over the P well.

15. The integrated circuit device of claim 14, wherein the fingers of the first terminal are strapped laterally outside of the P well in the lower metallization level and vertically connected to first terminal metal lines formed at higher metallization levels, and wherein the finger of the second terminal is vertically connected to second terminal metal lines formed at the higher metallization levels, wherein a first minimum distance between the second terminal metal lines and the first terminal metal lines is greater than a second minimum distance between the first conductive fingers and the second conductive finger by at least 5×.

16. The integrated circuit device of claim 14, wherein each of the first conductive fingers and the second conductive finger has a width between about 2.5 μm and about 7.5 μm.

17. The integrated circuit device of claim 1, wherein:
the semiconductor substrate is a p-type semiconductor substrate, and wherein the at least two wells include a P well and an N well forming a junction region therebetween, and wherein the deep well is a deep N well laterally extending underneath and contacting the N well and the P well,
the first heavily doped region of the first conductivity type is a first p+ region and the first heavily doped region of the second conductivity type is a first n+ region, the first p+ region and the first n+ region each formed in the N well,
the second heavily doped region of the first conductivity type is a second p+ region and the second heavily doped region of the second conductivity type is a second n+ region, the second p+ region and the second n+ region each formed in the P well, and the device comprises the first plurality of serially connected diodes having a threshold voltage, the diodes comprising:
the first n⁺ region and the first p⁺ region,
a first electrically floating metal layer formed over a surface of the N well and extending between but not overlapping the first n⁺ region and the first p⁺ region,
the second n⁺ region and the second p⁺ region, and
a second electrically floating metal layer formed over a surface of the P well and extending between but not overlapping the second n⁺ region and the second p⁺ region.

18. The integrated circuit device of claim 17, wherein the deep N well forms a tub surrounding the N well, the P well and the second N well, the tub contacting bottom and outer sides of the N well and the second N well.

19. The integrated circuit device of claim 17, wherein the electrical shorting structure comprises a metallization structure contacting the first n⁺ region and the second p⁺ region to form an electrical short therebetween.

20. The integrated circuit device of claim 19, wherein the metallization structure comprises metal lines formed in a first metallization level of the integrated circuit device.

21. The integrated circuit device of claim 17, further comprising:
a second N well forming a junction with the P well, wherein the deep N well laterally further extends to contact the second N well;
a second plurality of serially connected diodes having a second threshold voltage, comprising:
a third p+ region formed in the P well;
a third electrically floating metal layer formed over the surface of the P well and extending between but not overlapping the third p+ region and the second n+ region;
a fourth p⁺ region and a third n⁺ region each formed in the second N well; and
a fourth electrically floating metal layer formed over a surface of the second N well and extending between but not overlapping the fourth region and the third n⁺ region; and
a second PNPN silicon-controlled rectifier (SCR) having a second trigger voltage and comprising the third p⁺ region, the second N well, the deep N well, the P well and the third n⁺ region.

22. The integrated circuit device of claim 21, further comprising a fourth electrically floating metal layer formed over a surface crossing the junction between the N well and the P well and extending between but not overlapping the first n⁺ region and the second p⁺ region,
wherein each of the first and fourth p⁺ regions is connected to a first terminal serving as a common anode and the second n⁺ region is connected to a second terminal serving as a common cathode, the common anode and the common cathode being common for the serially connected diodes and the PNPN SCRs.

23. The integrated circuit device of claim 21, wherein each of the first to fourth electrically floating metal layers is formed of a p-type metal having a work function closer to a valence band edge of the semiconductor substrate compared to a conduction band edge of the semiconductor substrate.

24. The integrated circuit device of claim 23, wherein each of the first and second electrically floating metal comprises aluminum.

25. The integrated circuit device of claim 21, wherein the first n⁺ region laterally extends into the PW to contact the second p+ region to form a first electrical shorting structure, and wherein the third n+ region laterally extends into the PW to contact the third p+ region to form a second electrical shorting structure,
wherein each of the first and fourth p+ regions is connected to a first terminal serving as a common anode and the second n+ region is connected to a second terminal serving as a common cathode, the common anode and the common cathode being common for the serially connected diodes and the PNPN SCRs.

26. The integrated circuit device of claim 17, further comprising:
a second N well forming a junction with the P well, wherein the deep N well laterally further extends to contact the second N well;
a second plurality of serially connected diodes having a second threshold voltage, comprising:
a third n⁺ region formed in the P well,
a third electrically floating metal layer formed over the surface of the P well and extending between but not overlapping the third n⁺ region and the second p+ region,
a fourth n⁺ region and a third p⁺ region each formed in the second N well, and
a fourth electrically floating metal layer formed over a surface of the N well and extending between but not overlapping the fourth n⁺ region and the third p⁺ region; and
a second PNPN silicon-controlled rectifier (SCR) having a second trigger voltage and comprising the third p⁺ region, the second N well, the deep N well, the P well and the third n+ region.

27. The integrated circuit device of claim 26, wherein the first p⁺ region and the third p+ region are each connected to a first terminal, and wherein the second n⁺ region and the third n+ region are each connected to a second terminal.

28. The integrated circuit device of claim 27, wherein a first dielectric isolation is formed between the first p+ region and the second n⁺ region at the junction between the first NW and the PW, and wherein a second dielectric isolation is formed between the third n⁺ region and the third p⁺ region at the junction between the PW and the second NW.

29. The integrated circuit device of claim 27, wherein the first n⁺ region, the second p+ region and the fourth n⁺ region are each electrically connected to each other to form the electrically shorting structure that is at a common voltage node and is electrically floated.

30. The integrated circuit device of claim 26, further comprising a fifth electrically floating metal layer formed between the first p⁺ region and the second n+ region and crossing the junction between the first NW and the PW, and a sixth electrically floating metal layer formed between the third p⁺ region and the fourth n⁺ region and crossing the junction between the PW and the second NW.

\* \* \* \* \*

UNITED STATES PATENT AND TRADEMARK OFFICE
CERTIFICATE OF CORRECTION

PATENT NO. : 9,673,187 B2  Page 1 of 1
APPLICATION NO. : 14/796731
DATED : June 6, 2017
INVENTOR(S) : Javier A. Salcedo et al.

It is certified that error appears in the above-identified patent and that said Letters Patent is hereby corrected as shown below:

In the Specification

In Column 10 at Line 43, Change "exceeding" to --for example,--.

In Column 12 at Line 63, Change "(Ti)" to --(T1)--.

In Column 17 at Line 44, Change "200,'" to --200',--.

In the Claims

In Column 28 at Line 39, In Claim 3, change "first$^+$" to --first $n^+$--.

In Column 31 at Line 2, In Claim 17, after "diodes" delete "having a threshold voltage, the diodes".

In Column 31 at Line 40, In Claim 21, change "fourth" to --fourth $p^+$--.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*